(12) United States Patent
Katsumata et al.

(10) Patent No.: US 7,969,789 B2
(45) Date of Patent: Jun. 28, 2011

(54) METHOD FOR DRIVING NONVOLATILE SEMICONDUCTOR MEMORY DEVICE

(75) Inventors: Ryota Katsumata, Kanagawa-ken (JP); Masaru Kito, Kanagawa-ken (JP); Yoshiaki Fukuzumi, Kanagawa-ken (JP); Masaru Kidoh, Tokyo (JP); Hiroyasu Tanaka, Tokyo (JP); Megumi Ishiduki, Kanagawa-ken (JP); Yosuke Komori, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/536,226

(22) Filed: Aug. 5, 2009

(65) Prior Publication Data

US 2010/0034028 A1 Feb. 11, 2010

(30) Foreign Application Priority Data

Aug. 6, 2008 (JP) .................................. 2008-202964

(51) Int. Cl.
*G11C 16/04* (2006.01)
(52) U.S. Cl. .......... 365/185.28; 365/185.17; 365/185.18
(58) Field of Classification Search ............. 365/185.28, 365/185.17, 185.18
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 7,023,739 B2 * | 4/2006 | Chen et al. | 365/185.28 |
| 7,233,522 B2 * | 6/2007 | Chen et al. | 365/185.02 |
| 2007/0252201 A1 | 11/2007 | Kito et al. | |

FOREIGN PATENT DOCUMENTS

JP 2007-266143 10/2007

* cited by examiner

*Primary Examiner* — Huan Hoang
(74) *Attorney, Agent, or Firm* — Oblon, Spivak, McClelland, Maier & Neustadt, L.L.P.

(57) ABSTRACT

In a nonvolatile semiconductor memory device having n (n is an integer of two or more) electrode films stacked and having charge storage layers provided above and below each of the electrode films, when data "0" is written by injecting electrons into the charge storage layer on a source line side of a memory cell of the number k (k is an integer of 1 to (n−1)) as counted from an end on a bit line side in a selected semiconductor pillar, positive program potential is given to the electrode film of the number 1 to k as counted from the bit line side, and 0V is given to the electrode film of the number (k+1) to n, therewith positive potential is given to the bit line and 0 V is given to the source line.

20 Claims, 25 Drawing Sheets

DATA「00」

DATA「01」

DATA「10」

DATA「11」

FIG. 6

| OPERATION | POSITION OF CHARGE ACCUMULATION LAYER IN CELL/STEP | BIT LINE | UPPER SELECTIVE GATE | ELECTRODE FILM (CONTROL GATE ELECTRODE) MEMORY CELL ON BIT LINE SIDE FROM SELECTED CELL | SELECTED CELL | MEMORY CELL ON SOURCE LINE SIDE FROM SELECTED CELL | LOWER SELECTIVE GATE | SOURCE LINE |
|---|---|---|---|---|---|---|---|---|
| WRITING | SOURCE SIDE | Vdd or 0V | Vdd(ON) | Vpgm | Vpgm | 0V | 0V(OFF) | 0V |
| WRITING | BIT SIDE | 0V | 0V(OFF) | 0V | Vpgm | Vpgm | Vdd(ON) | Vdd or 0V |
| ERASING | SOURCE SIDE | Verase or 0V | Vpass(ON FOR HOLES) | Verase | Verase | Vpass | Vpass(ON FOR HOLES) | 0V |
| ERASING | BIT SIDE | 0V | Vpass(ON FOR HOLES) | Vpass | Verase | Verase | Vpass(ON FOR HOLES) | Verase or 0V |
| COMMON TO READING | S11, S21, S31 | RELATIVELY HIGH POTENTIAL | Vdd(ON) | Vdd(ON) | Vread | Vdd(ON) | Vdd(ON) | RELATIVELY LOW POTENTIAL |
| READING (1) | S13 | RELATIVELY LOW POTENTIAL | Vdd(ON) | Vdd(ON) | Vread | Vdd(ON) | Vdd(ON) | RELATIVELY HIGH POTENTIAL |
| READING (2) | S23 | RELATIVELY HIGH POTENTIAL | Vdd(ON) | Vdd(ON) | Vread | BETWEEN Vdd AND Vread ONLY IN ADJACENT CELL / Vdd(ON) | Vdd(ON) | RELATIVELY LOW POTENTIAL |
| READING (3) | S33 | HIGH POTENTIAL +β | Vdd(ON) | Vdd(ON) | Vread | Vdd(ON) | Vdd(ON) | RELATIVELY LOW POTENTIAL |

Vpgm > Vdd > Vread > 0 > Vpass > Verase

| DATA | 01 | 10 |
|---|---|---|
| STEP S31 | Vgs=G−A=5V, G=5V, C=5V, B=2.5V, A=0V, D (BIT LINE SIDE) — S (SOURCE LINE SIDE) | G=5V, Vgs=G−B=2.5V, C=5V, B=2.5V, A=0V, D (BIT LINE SIDE) — S (SOURCE LINE SIDE) |
| ⇩ | DRAIN VOLTAGE: INCREASE | DRAIN VOLTAGE: INCREASE |
| STEP S33 | Vgs=G−A=5V, G=5V, C=6V, B=3V, A=0V, D (BIT LINE SIDE) — S (SOURCE LINE SIDE) | G=5V, Vgs=G−B=2V, C=6V, B=3V, A=0V, D (BIT LINE SIDE) — S (SOURCE LINE SIDE) |
| CHANGE | Vgs : CONSTANT → Vth : CONSTANT | Vgs : DECREASE → Vth : INCREASE |

METHOD FOR DRIVING NONVOLATILE SEMICONDUCTOR MEMORY DEVICE

CROSS-REFERENCE TO RELATED APPLICATIONS

This application is based upon and claims the benefit of priority from the prior Japanese Patent Application No. 2008-202964, filed on Aug. 6, 2008; the entire contents of which are incorporated herein by reference.

BACKGROUND OF THE INVENTION

This invention relates to a method for driving a nonvolatile semiconductor memory device in which a plurality of insulating films and a plurality of electrode films are alternately stacked and charge storage layers are disposed in both sides of each of the electrode films.

BACKGROUND ART

Conventionally, a nonvolatile semiconductor memory device such as a flash memory has been manufactured by two-dimensionally integrating elements on a surface of a silicon substrate. In such a flash memory, for increasing a memory capacity by lowering cost per bit, downsizing has to be achieved by making the individual elements smaller, but in recent years, the downsizing has also become difficult in cost and in technique.

As a technique for breaking through the limit of high integration, there have been proposed a large number of ideas of three-dimensionally integrating elements. However, a general three-dimensional device requires at least three times of lithography process, and therefore, increase of cost along with increase of the lithography process comes to cancel reduction of cost by reduction of area of the silicon substrate, and it is difficult to reduce cost even if the three-dimensional integration is performed.

Under conceiving the problem, the present inventors have proposed a three-dimensional stacked memory of a lump processing type (see, for example, JP-A 2007-266143 (Kokai)). In this technique, electrode films and insulating films are alternately stacked to form a stacked body on a silicon substrate, and then, through-holes are formed by lump processing in the stacked body. And, charge storage layers are formed on the side surfaces of the through-holes, and silicon pillars are formed through burying silicon inside the through-holes. Thereby, a memory cell is formed in each of the intersection parts of the electrode films and silicon pillars.

In the three-dimensional stacked memory of lump processing type, charge is taken in or out from the silicon pillars to the charge storage layers by controlling potential of each of the electrode films and each of the silicon pillars, and thereby, information can be recorded. According to this technique, chip area per bit can be reduced to reduce the cost by stacking a plurality of electrode films on a silicon substrate. Moreover, because the three-dimensional stacked memory can be manufactured by lump-processing the stacked body, even when the number of the stacked layers increases, the number of times of the lithography process does not increase, increase of the cost can be suppressed.

However, in the three-dimensional stacked memory of lump processing type manufactured as described above, although stacking can reduce the chip area per bit, there is a problem that it is difficult to downsize the planar structure. Moreover, there is a problem that interference between the memory cells increases with the distance between memory cells sharing the silicon pillar.

SUMMARY OF THE INVENTION

According to an aspect of the invention, there is provided a method for driving a nonvolatile semiconductor memory device, the device having a stacked body in which insulating films and n (n is an integer of two or more) electrode films are alternately stacked and in which a through-hole extending in a stacking direction is formed, a semiconductor pillar buried inside the through-hole, and one pair of charge storage layers disposed in both sides of the electrode film in the stacking direction for each of the electrode films, the method including: giving relatively high potential to the electrode films of the number 1 to k (k is an integer of 1 to (n−1)) as counted from one end of the semiconductor pillar, giving relatively low potential to the electrode films of the number (k+1) to n, and therewith setting potential of the one end of the semiconductor pillar to be higher than potential of the other end, thereby injecting electrons into the charge storage layer on the other end side of one pair of the charge storage layers disposed on both sides of the electrode film of the number k.

According to another aspect of the invention, there is provided a method for driving a nonvolatile semiconductor memory device, the device having, a stacked body in which insulating films and n (n is an integer of two or more) electrode films are alternately stacked and in which a through-hole extending in a stacking direction is formed, a semiconductor pillar buried inside the through-hole, and one pair of charge storage layers disposed on both sides of the electrode film in the stacking direction for each of the electrode films, the method including: giving relatively low potential to the electrode films of the number 1 to k as counted from the one end of the semiconductor pillar, giving relatively high potential to the electrode films of the number (k+1) to n, therewith setting potential of the one end of the semiconductor pillar to be lower than potential of the other end, and thereby injecting holes into the charge storage layer on the other end side of one pair of the charge storage layers disposed on both sides of the electrode film of the number k.

According to another aspect of the invention, there is provided a method for driving a nonvolatile semiconductor memory device, the device having a stacked body in which insulating films and n (n is an integer of two or more) electrode films are alternately stacked and in which a through-hole extending in a stacking direction is formed, a semiconductor pillar buried inside the through-hole, and one pair of charge storage layers disposed on both sides of the electrode film in the stacking direction for each of the electrode films, the method including: a first discriminating: giving reading potential by which a resistance value of a part corresponding to the electrode film of the number k (k is an integer of 1 to n) of the semiconductor pillar is different according to whether electrons are stored in the charge storage layers on both sides of the electrode film of the number k, to the electrode film of the number k as counted from the one end of the semiconductor pillar, giving ON potential by which parts corresponding to the electrode films other than the electrode film of the number k of the semiconductor pillar are turned into ON state, to the electrode films other than the electrode film of the number k, in the state thereof, giving higher potential to the one end of the semiconductor pillar than that of the other end to detect current flowing through the semiconductor pillar, and thereby discriminating that electrons are stored in both of the one pair of the charge storage layers disposed on both sides of the electrode film of the number k or that electrons are stored in only one of the both thereof or that electrons are not stored in the both thereof; and a second discriminating: discriminating that electrons are stored in the charge storage layer on the one end side as seen from the electrode film of the number k of the one pair of charge storage layers or that electrons are stored in the charge storage layer on the other end side thereof when electrons are stored in only one of the one pair of charge storage layers.

BRIEF DESCRIPTION OF THE DRAWINGS

FIG. 6 is a view illustrating each of potential of wires and electrodes in each of operations;

FIG. 18 is a view illustrating change of the threshold voltage in transferring from Step S31 to Step S33 shown in FIG. 17;

DETAILED DESCRIPTION OF THE INVENTION

Hereinafter, an embodiment of the invention will be described with reference to drawings.

First, a structure of the nonvolatile semiconductor memory device according to this embodiment will be described.

Figure 1:
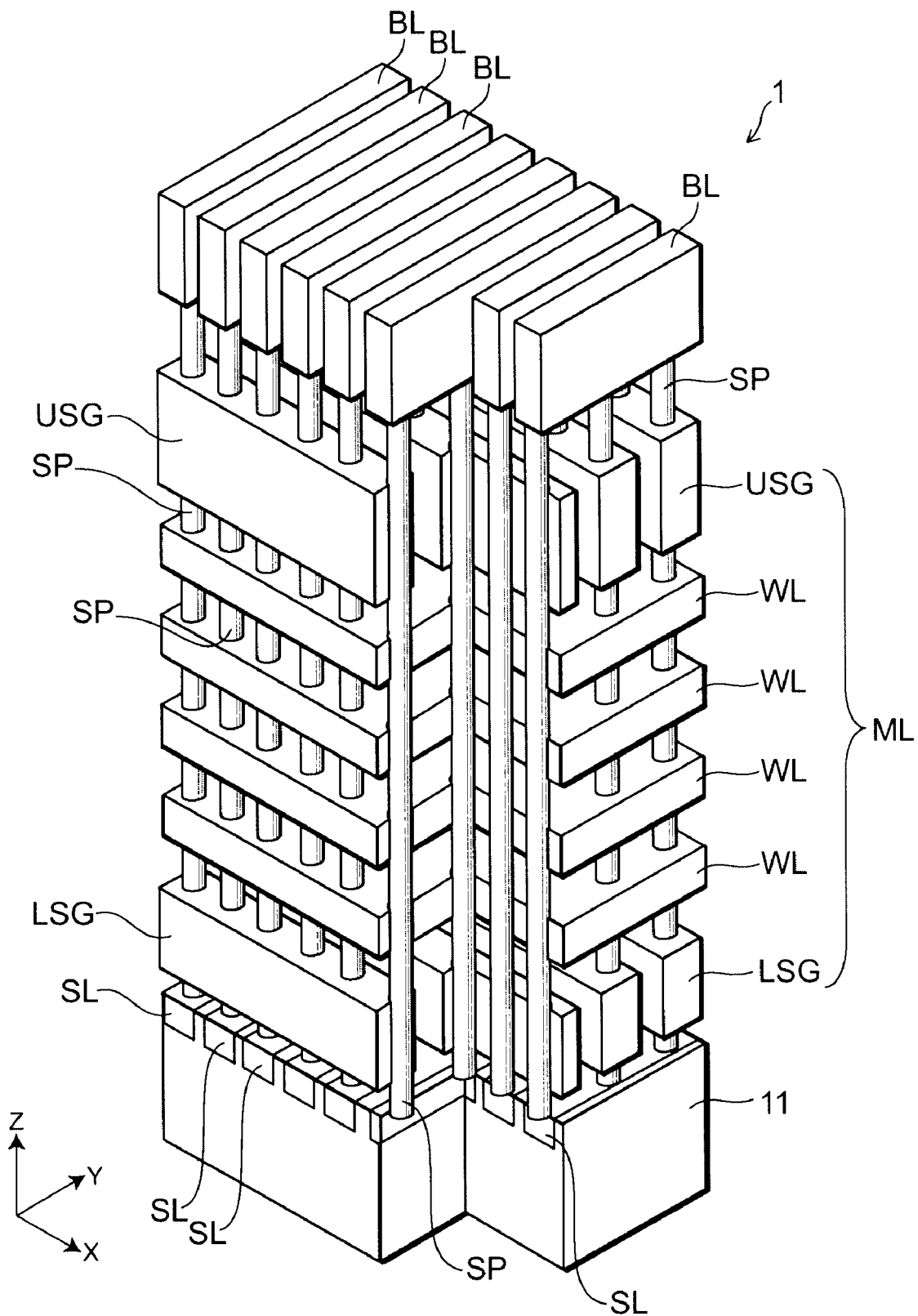
FIG. 1 is a perspective view illustrating the nonvolatile semiconductor memory device according to an embodiment of the invention.

FIG. 1 is a perspective view illustrating the nonvolatile semiconductor memory device according to this embodiment.

Figure 2:
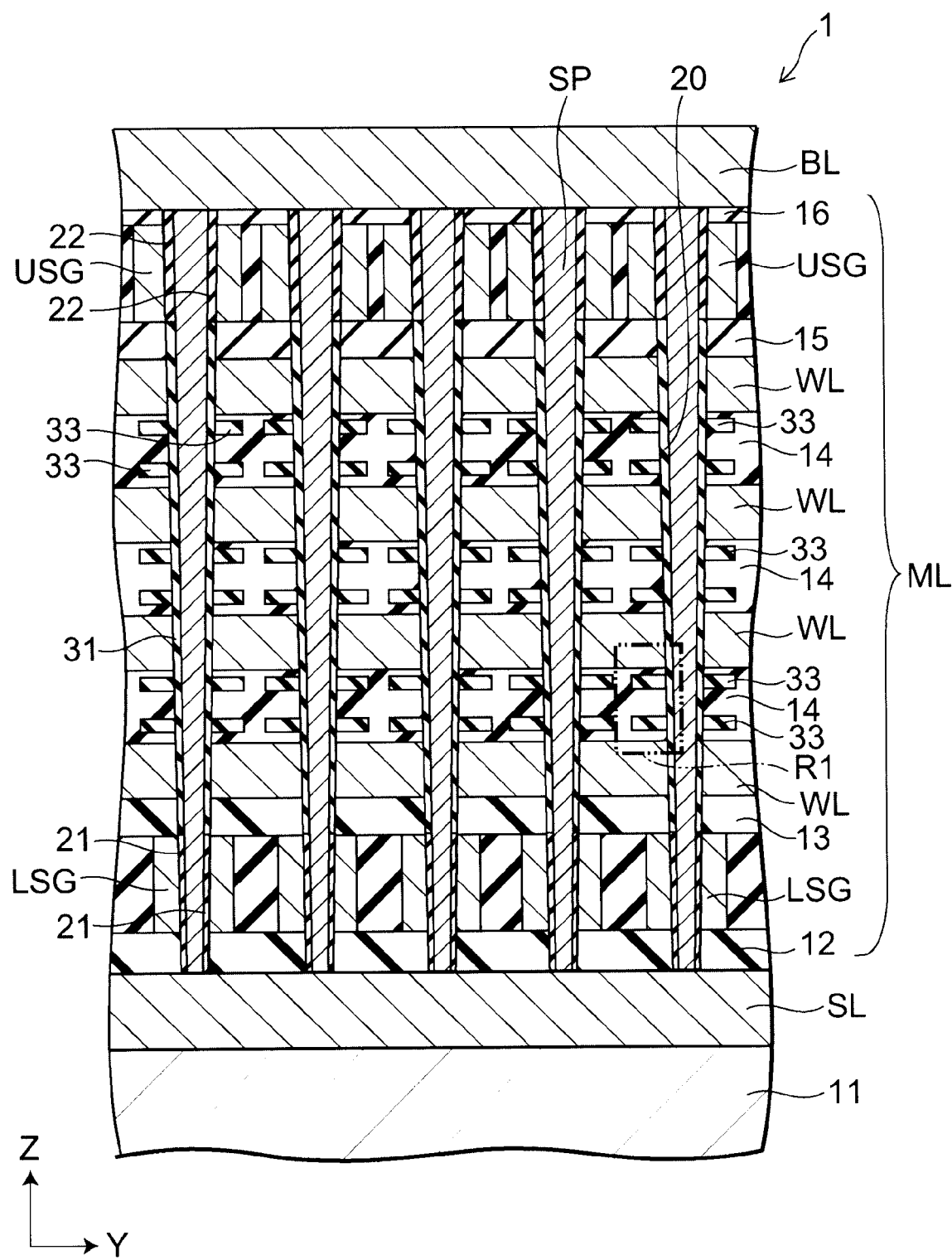
FIG. 2 is a cross-sectional view illustrating the nonvolatile semiconductor memory device according to this embodiment.

FIG. 2 is a cross-sectional view illustrating the nonvolatile semiconductor memory device according to this embodiment.

Figure 3:
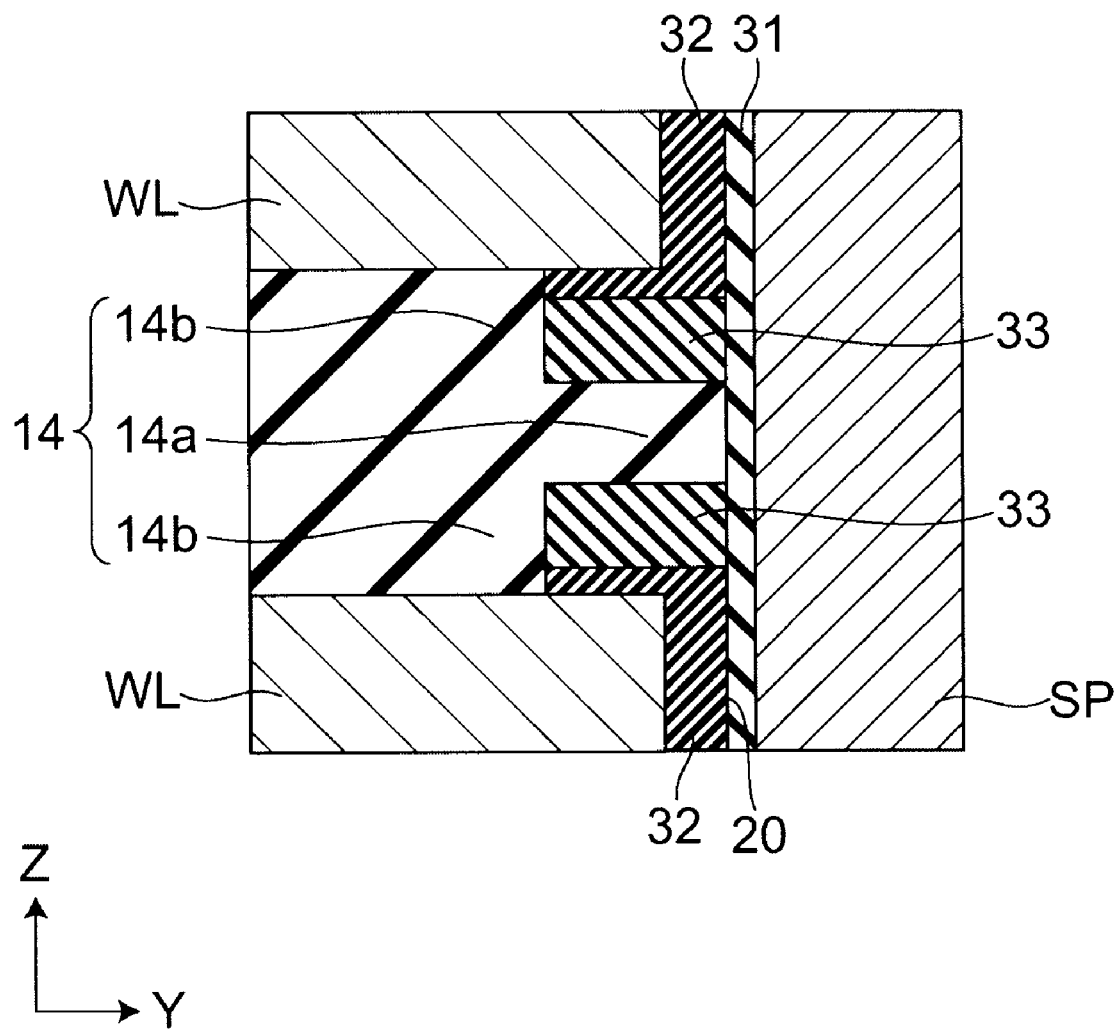
FIG. 3 is a partial enlarged cross-sectional view illustrating the region R1 shown in FIG. 2.

FIG. 3 is a partial enlarged cross-sectional view illustrating the region R1 shown in FIG. 2.

Figure 4:
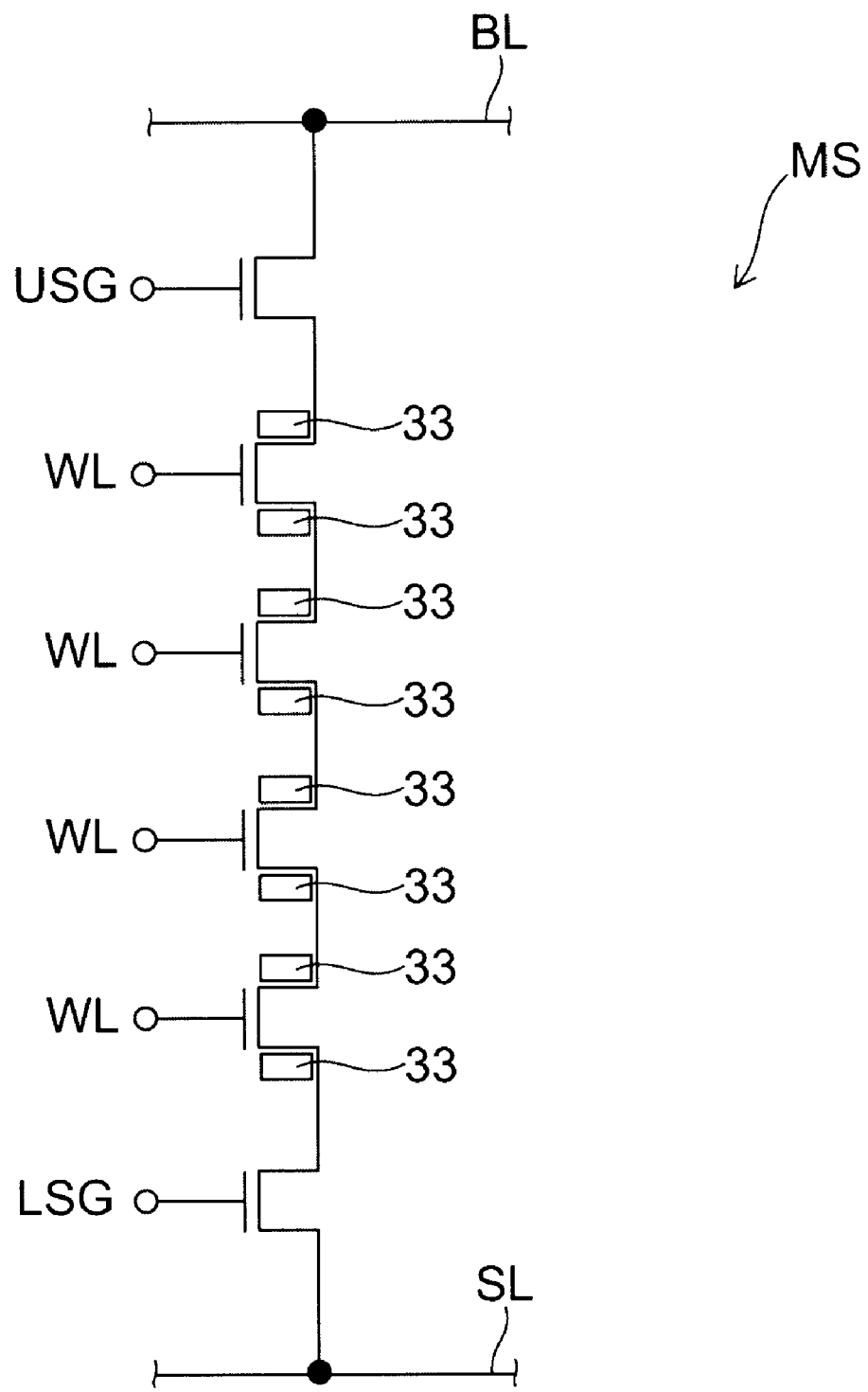
FIG. 4 is an equivalent circuit diagram illustrating one memory string in the nonvolatile semiconductor memory device according to this embodiment.

FIG. 4 is an equivalent circuit diagram illustrating one memory string in the nonvolatile semiconductor memory device according to this embodiment.

As shown in FIGS. 1 to 4, the nonvolatile semiconductor memory device 1 (hereinafter, simply also referred to as "device 1") according to this embodiment is a flash memory of three-dimensional stacking type. As described later, cell transistors are arranged in a three-dimensional matrix form in the device 1. Moreover, in each of the cell transistor, a control gate electrode and charge storage layers are provided, and each of the cell transistors functions as a memory cell storing data by storing charge in the charge storage layer by controlling the potential of the control gate electrode. And, this embodiment is characterized in that the charge storage layer is divided by the cell transistors and that one pair of the charge storage layers are placed on both sides of the control gate electrode. Hereinafter, the entire structure of the device 1 will be simply described, and then, the characterizing portion of this above-described embodiment will be described in detail.

First, the entire structure of the device 1 will be simply described.

As shown in FIGS. 1 and 2, a silicon substrate 11 made of, for example, single crystal silicon is provided in the nonvolatile semiconductor memory device 1 according to this embodiment. In the silicon substrate 11, a memory array region in which a memory cell is formed and a circuit region (not shown) for driving the memory cell are set.

Hereinafter, in this specification, for the convenience of description, an XYZ orthogonal coordinate system is introduced. In this coordinate system, two directions parallel to the upper surface of the silicon substrate 11 and orthogonal to each other are set to be an X direction and a Y direction, and the direction orthogonal to both of the X direction and the Y direction is set to be a Z direction.

In a memory array region, impurities are introduced selectively into a surface layer part of the silicon substrate 11, and a plurality of source lines SL extending in the Y direction are formed. Moreover, on the silicon substrate 11, an insulating film 12, a lower selective gate LSG, and an insulating film 13 are stacked in this order, and a lower gate stacked body is provided. The lower selective gate LSG is made of a conductive material such as poly silicon. The insulating films 12 and 13 are made of an insulating material such as silicon oxide.

Moreover, a plurality of insulating films 14 and a plurality of electrode films WL are alternately stacked above the lower gate stacked body. The electrode films WL are made of conductive material such as amorphous silicon or poly silicon provided with conductive property by introducing impurities thereinto. Predetermined potential is given to the electrode films WL by a driver circuit (not shown) formed in a circuit region, and the electrode films WL functions as word lines of the device 1. The insulating films 14 are made of, for example, silicon oxide, and functions as interlayer insulating films insulating the electrode films WL. A memory stacked body is constituted of the plurality of insulating films 14 and the plurality of electrode films WL. In the example shown in FIG. 1, four layers of electrode films WL are provided. However, the invention is not limited thereto.

Furthermore, an insulating film 15, an upper selective gate USG, an insulating film 16 are stacked in this order above the memory stacked body, and thereby, an upper gate stacked body is provided. The upper selective gate USG is made of conductive material such as poly silicon. The insulating films 15 and 16 are made of, for example, silicon oxide. Each of the above layers may be a multilayer film. For example, the insulating film may be a film in which a silicon oxide layer and a silicon nitride layer are stacked. Moreover, between the above respective films, a film other than the above films may be provided.

Each of the lower selective gate LSG and the upper selective gate USG is formed by dividing one conductive film along the Y direction, and comes to be a wire-shaped conductive member. By contrast, the electrode film WL is not divided by the lower selective gate LSG and the upper selective gate USG. Around the lower selective gate LSG and the upper selective gate USG and the electrode films WL, insulating films are provided.

And, a plurality of through-holes 20 (see FIG. 2) extending to the stacking direction (Z direction) are formed in the lower gate stacked body and the memory stacked body and the upper gate stacked body (hereinafter, generically referred to as "stacked body ML"). Each of the through-holes 20 passes through the entire stacked body ML. Moreover, the through-holes are arranged in a matrix formed along, for example, the X direction and Y direction.

Silicon pillars SP as the semiconductor pillars are buried inside each of the through-holes 20. The silicon pillars SP are made of semiconductor such as amorphous silicon. The silicon pillar SP may be made of other semiconductor materials such as poly silicon. Moreover, it is possible that impurities are doped to these semiconductor materials and that impurities are not doped thereto. The shape of the silicon pillar SP is a columnar shape extending in the Z direction, such as, a circular cylinder shape. Moreover, the silicon pillar is provided over the entire length of the stacking direction of the stacked body ML, and the lower part thereof is connected to the source line SL.

A lower gate insulating film 21 is provided between the silicon pillar SP and the lower selective gate LSG. Thereby, a lower selective transistor in which the silicon pillar SP is the body region including the channel region and in which the lower gate insulating film 21 is the gate insulating film and in which the lower selective gate LSG is the gate electrode is formed in the lower gate stacked body.

Moreover, an upper gate insulating film 22 is provided between the silicon pillar SP and the upper selective gate USG. Thereby, an upper selective transistor in which the silicon pillar SP is the body region including the channel region and in which the upper gate insulating film 22 is the gate insulating film and in which the upper selective gate USG is the gate electrode is formed in the upper gate stacked body.

Furthermore, a plurality of bit lines BL extending in the Y direction are provided above the insulating film 16. The bit lines BL are made of metal. Each of the bit lines BL is disposed to pass through the immediately upper region of each row of silicon pillars SP arranged along the Y direction and is connected to upper end of the silicon pillar SP. Thereby, the silicon pillar SP is connected between the bit line BL and the source line SL. Moreover, the silicon pillars SP is connected to different bit lines BL and source lines SL every rows extending in the Y direction.

Next, the characterizing portion of this embodiment will be described.

As shown in FIGS. 2 and 3, a tunnel insulating layer 31 is formed on all region of the side surface of the through-hole 20. The tunnel insulating layer 31 usually has insulating property, but flows tunnel current when predetermined voltage in the range of driving voltage of the device 1 is applied thereto. The tunnel insulating layer 31 is made of, for example, silicon oxide. The surface facing the inside of the through-hole 20 in the tunnel insulating layer 31 is in contact with the outer surface of the silicon pillar SP.

Moreover, a block insulating layer 32 is provided between the electrode film WL and the tunnel insulating layer 31. The block insulating layer 32 is a film through which current is not substantially flowed even when voltage is applied thereto in the range of the driving voltage of the device 1. The block insulating layer 32 extends in the direction backing away from the through-hole 20 on the upper or lower surface of the electrode film WL so as to go around the corner of the top or bottom of the though-hole 20 side of the electrode film WL. The block insulating layer 32 is made of, for example, oxidizing silicon originally forming the electrode film WL.

The central portion 14a of the insulating film 14 in the stacking direction (Z direction) sticks out from the peripheral portions 14b of the insulating film 14, namely, the portions contacting with the electrode-film WL to the silicon pillar SP side. And, a charge storage layer 33 is provided between the peripheral portion 14b of the insulating film 14 and the tunnel insulating layer 32 and between the central portion 14a of the insulating film 14 and the block insulating layer 32. Thereby, the charge storage layers 33 are disposed on both sides of the electrode film WL in the Z direction for each of the electrode films WL. That is, one pair of charge storage layers 33 are provided for one memory cell. Seen from the Z direction, the shape of the charge storage layer 33 is an annular shape surrounding the silicon pillar SP. Moreover, the charge storage layer is made of a material that can trap charge such as silicon nitride.

The charge storage layer 33 is surrounded by the central portion 14a of the insulating film 14, the peripheral portion 14b, the block insulating layer 32, and the tunnel insulating layer 31. Thereby, the tunnel insulating layer 31 lies between the charge storage layer 33 and the silicon pillar SP, and the block insulating layer 32 lies between the charge storage layer 33 and the electrode film WL. As a result the charge storage layer 33 is insulated from the WL and the silicon pillar SP.

The charge storage layer 33 is not provided between the central portion 14a of the insulating film 14 and the tunnel insulating layer 31. Thereby, the charge storage layers 33 belonging to the adjacent memory cells are separated each other by the central portion 14a of the insulating film 14. Also, the charge storage layer 33 is not provided between the electrode film WL and the silicon pillar SP. Thereby, the charge electrodes disposed above and below each of the electrode films WL are also separated from each other.

By such a structure, the silicon pillar SP functions as the body region, and the electrode film WL functions as the control gate, and the charge storage layer 33 functions as the charge trap in the nonvolatile semiconductor memory device 1, and thereby, a cell transistor is formed in each of the intersect parts between the silicon pillar SP and the electrode film WL. The cell transistor composes the memory cell.

And, as shown in FIG. 4, the memory cells of the same number as the electrode films WL are disposed in one row in the Z direction in one silicon pillar SP and around the silicon pillar SP, and thereby one memory string MS is constituted. The upper end of the memory string MS is connected to the bit line BL, and the lower end thereof is connected to the source line SL, and the upper selective transistor is provided in the upper end thereof, and the lower selective transistor is provided in the lower end thereof, and several memory cells are serially connected between the upper selective transistor and the lower selective transistor. That is, the source of a certain cell transistor is connected to the drain of another transistor.

Moreover, a plurality of silicon pillars SP are arranged in a matrix form along the X direction and the Y direction in the memory stacked body of the device 1, and thereby, a plurality of memory strings MS are arranged in a matrix form. Thereby, a plurality of memory cells are arranged three-dimensionally along the X direction, the Y direction, and the Z direction in the memory stacked body.

Next, a method for driving the nonvolatile semiconductor memory device according to this embodiment will be described.

FIGS. 5A to 5D are views showing the relation between the storage state of electrons and the value of written data in the charge storage layer.

FIG. 6 is a view illustrating each of potential of wires and electrodes in each of operations.

Figure 13:
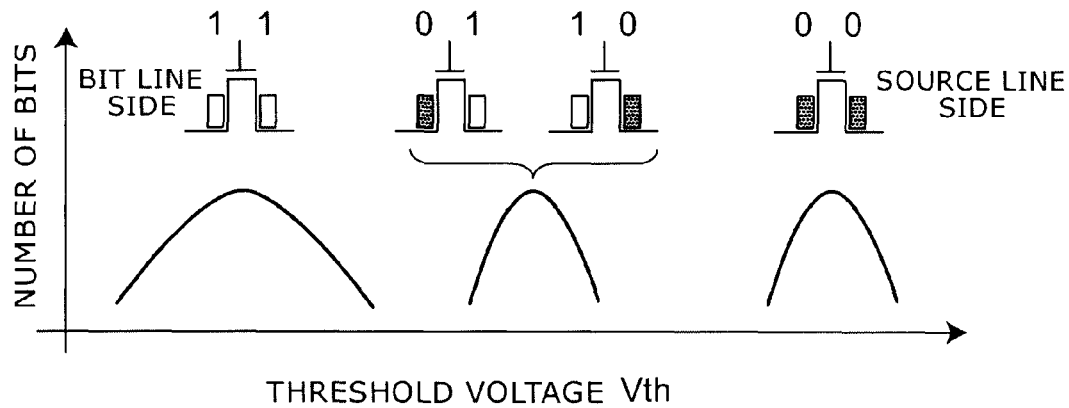
FIG. 13 is a graph illustrating distribution of threshold voltage of a cell transistor in Step S11 of FIG. 12.

In FIGS. 5A to 5D, the charge storage layer in which electrons are stored is shown by black rectangle (■), and the charge storage layer in which electrons are not stored is shown by white rectangle (□). In FIG. 13 to be described later, this is the same.

In this embodiment, the state in which electrons are stored in the charge storage layer is set to be data "0", and the state in which electrons are not stored is set to be data "1". Moreover, the cell transistor operates as an N-channel type transistor in writing and in reading, and the threshold voltage of the cell transistor in which the data "0" is written is higher than the threshold voltage of the cell transistor in which the data "1" is written.

And, according to this embodiment, as shown in FIGS. 5A to 5D, two-value data of "0" or "1" can be written independently each other in one pair of charge storage layers belonging to each of the memory cells. Thereby, two bits and four kinds of data of "00", "01", "10", and "11" can be stored for each of the memory cells.

Figure 5A:
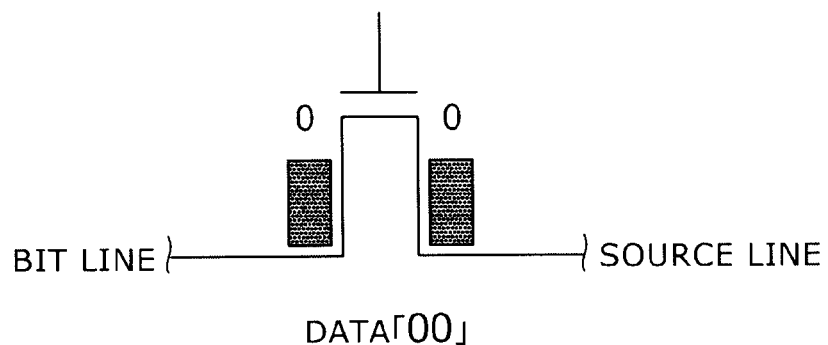
FIGS. 5A to 5D are views showing the relation between the storage state of electrons and the value of written data in the charge storage layer.
Figure 5B:
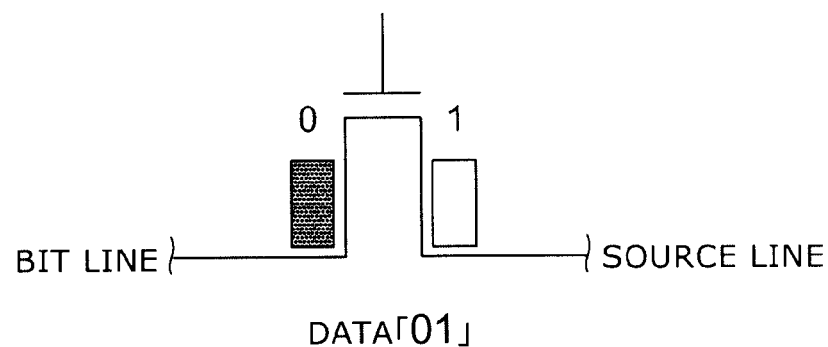
Figure 5C:
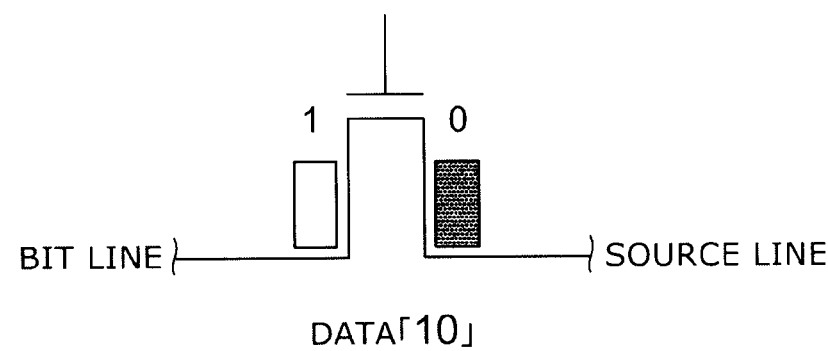
Figure 5D:
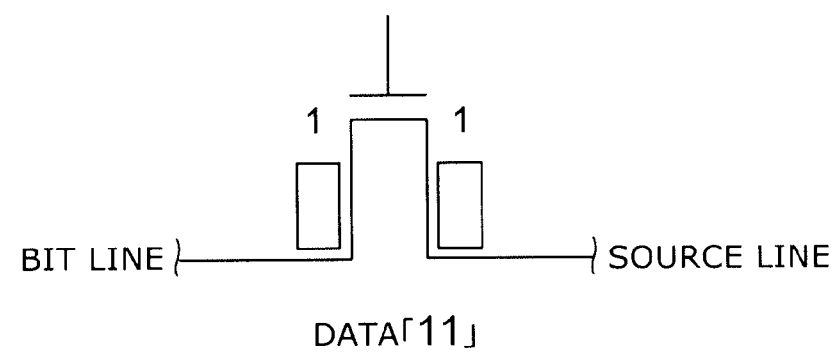

That is, as shown in FIG. 5A, the state in which electrons are stored in both of the one pair of charge storage layers is data "00". As shown in FIG. 5B, the state in which electrons are stored in the charge storage layer on the bit line side and electrons are not stored in the charge storage layer on the source line side is data "01". As shown in FIG. 5C, the state in which electrons are not stored in the charge storage layer on the bit line side and electrons are stored in the charge storage layer on the source line side is data "10". As shown in FIG. 5D, the state in which electrons are not stored in both of the charge storage layers is data "11".

First, a method for writing data will be described.

Figure 7A:
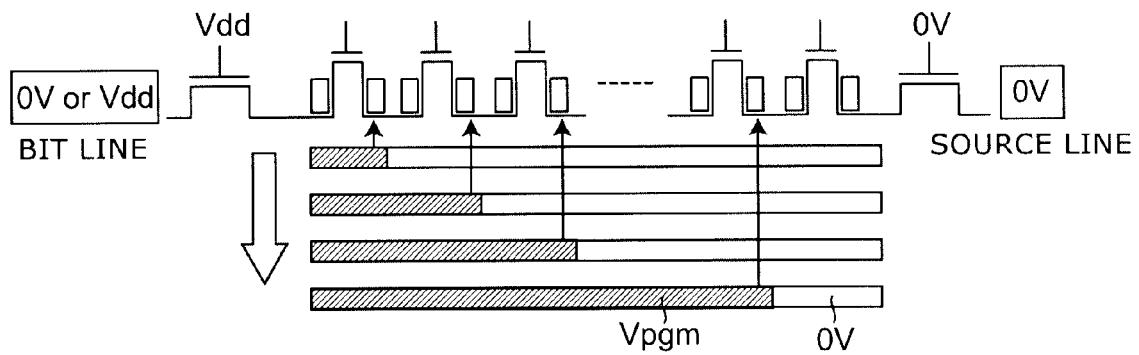
FIGS. 7A and 7B are a view illustrating the writing method according to this embodiment.
Figure 7B:
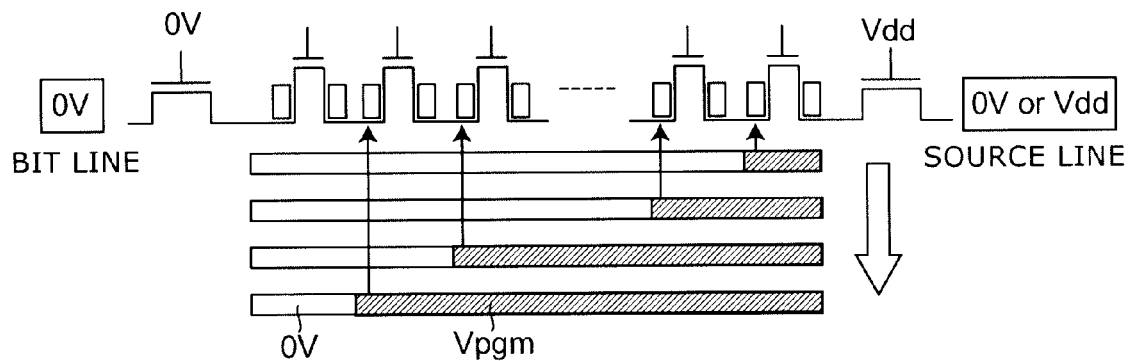

FIGS. 7A and 7B are a view illustrating the writing method according to this embodiment. FIG. 7A shows the case of writing data in the charge storage layer on the source line side as seen from the electrode film in each of the memory cells, and FIG. 7B shows the case of writing data in the charge storage layer on the bit line side.

Figure 8:
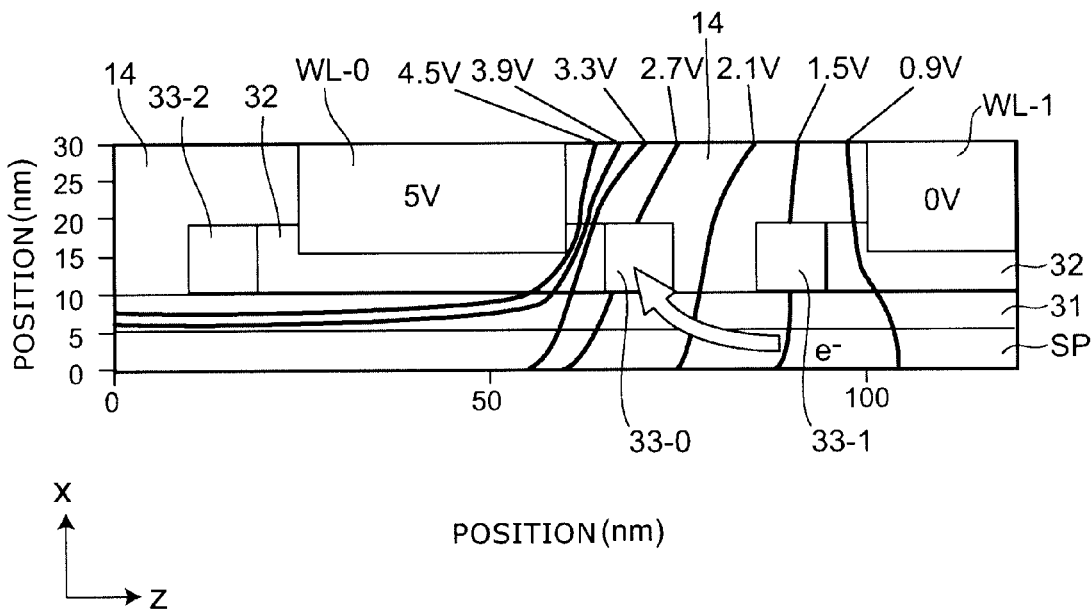
FIG. 8 is a view showing the simulation result of potential distribution in the memory cell in the writing operation when position in the Z direction is set in a horizontal axis and position in the X direction is set in a vertical axis.

FIG. 8 is a view showing the simulation result of potential distribution in the memory cell in the writing operation when position in the Z direction is set in a horizontal axis and position in the X direction is set in a vertical axis.

First, as shown in FIGS. 6 and 7A, the case of writing data in the charge storage layer 33 located on the source line SL side as seen from the electrode film WL, namely, on the lower side in FIG. 2 in each of the memory cells will be described.

In the following description, for convenience, potential in which the transistor formed in the silicon pillar SP is turned into ON state is referred to as "ON potential Vdd", and potential in which the transistor is turned into OFF state is referred to as "0V". The potential Vdd is set to be higher than the potential 0V.

Moreover, electrons are not injected into all of the charge storage layers 33 in the initial stage, and the values of data are set to be "1".

First, the charge storage layer to be written (hereinafter, also referred to as "selected charge storage layer") is selected. And, potential of the upper selective gate USG intersecting with the silicon pillar SP (hereinafter, referred to as "selected pillar") passing through the memory cell to which the selected charge storage layer belongs (hereinafter, also referred to as "selected cell") is set to be the potential Vdd. Thereby, the upper selective transistor of the selected pillar is turned into ON state. On the other hand, the potential of the lower selective gate LSG intersecting with the selected pillar is set to be 0V. Thereby, the lower selective transistor is turned into OFF state. In this case, all of the potential of the upper selective gates USG and the lower selective gates LSG passing through the silicon pillars except for the selected pillar are set to 0V. Thereby, all of the upper selective gates USG and the lower selective gates LSG of the silicon pillars except for the selected pillar are turned into OFF state.

Moreover, the potential of the electrode films WL of the selected cell and the memory cells disposed on the bit line BL side from the selected cell are set to be the program potential Vpgm. The program potential Vpgm is potential higher than 0V and, for example, is potential higher than the ON potential Vdd. That is, Vpgm>Vdd>0 is satisfied. On the other hand, the potential of the electrode films WL of the memory cells disposed on the source line SL side from the selected sell are set to be 0V.

In this state, the potential of the bit line BL connected to the selected pillar is controlled in accordance with the data to be written in the selected charge storage layer. For example, in the case of writing the data "0" in the selected charge storage layer, the potential of the bit line BL is set to be Vdd. In the case of writing the data "1", the potential of the bit line BL is set to be 0V. Moreover, the potential of the source line SL connected to the selected pillar is set to be 0V independently from the value of data to be written.

Thereby, in the case of writing the data "0", electric field in which the bit line BL side is a positive pole and the source line SL side is a negative pole is formed in the selected pillar. FIG. 8 shows a simulation result of the electric field formed in this case and shows the case where the potential Vdd and the program potential Vpgm are 5 V. As shown in FIG. 8, the electric field in the selected pillar concentrates between the group of the electrode films WL having potential of Vdd (5 V) and the group of the electrode films WL having potential of 0V. That is, the potential of an electrode film WL-0 of the selected cell is 5 V and the potential of an electrode film WL-1 existing on the source line side by one from the electrode film WL-0 is 0V, and therefore, the electric field concentrates between the electrode film WL-0 and the electrode film WL-1. Moreover, electric field is formed between the silicon pillar SP and the electrode films WL having the potential of 5 V. As a result, equipotential surfaces are formed so as to wrap around the source line side and the silicon pillar side in the electrode film WL-0, and thereby the electric field concentrates on the vicinity of a selected charge storage layer 33-0. In FIG. 8, the selected charge storage layer to be written in the charge storage layers 33 is shown by the sign "33-0". Moreover, the charge storage layer on the source line side by one as seen from the selected charge storage layer 33-0 is shown by the sign "33-1", and the charge storage layer on the bit line side by one is shown by the sign "33-2".

As a result, in the vicinity of the selected charge storage layer 33-0 in the selected pillar, electrons are accelerated in the direction toward the bit line BL to become hot electrons. And, pairs of electrons and holes are generated from the hot electrons, and the electrons of the pairs are attracted to the electrode film WL-0 and injected into the selected charge storage layer 33-0. As described above, by HCI (Hot Carrier Injection), the data "0" is written in the selected charge storage layer 33-0.

On the other hand, in the case of writing the data "1" in the selected charge storage layer 33-0, the potential of the source line SL and the potential of the bit line BL are set to 0V, and thus, the electric field in the Z direction is not formed in the selected pillar, and the electrons are not accelerated toward the bit line. Therefore, electrons are not injected into the selected charge storage layer 33-0 by HCI. Moreover, the value of the program potential Vpgm and the thickness of the tunnel insulating layer 31 and so forth are designed so that electrons are not injected into the selected charge storage layer 33-0 by FN (Fowler-Nordheim) tunnel current. As a result, electrons are not injected into the selected charge storage layer 33, and the data remains "1".

As described above, by setting the potential of the bit line BL connected to the selected pillar, request data can be written in the selected charge storage layer 33-0.

In this case, error-writing to the charge storage layers disposed in the vicinity of the selected charge storage layer 33-0 becomes a problem, and thus, the problem will be discussed below.

Figure 9:
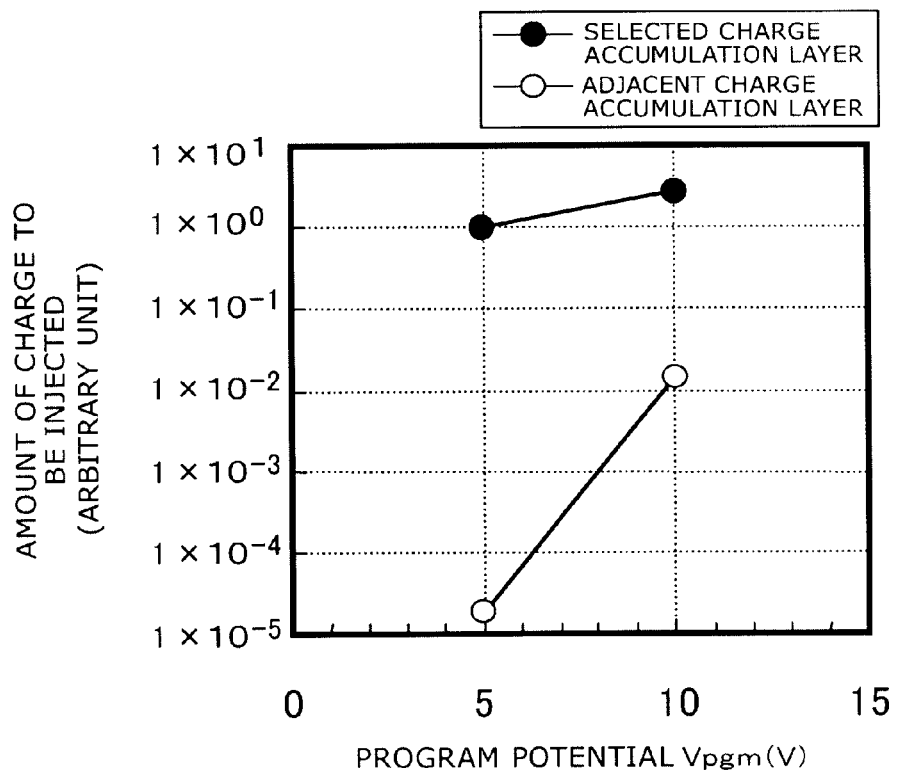
FIG. 9 is a graph illustrating degree of error-writing by hot electron injection.

FIG. 9 is a graph illustrating degree of error-writing by hot electron injection, in which the horizontal axis represents value of the program potential Vpgm and the vertical axis represents the amount of charge to be injected into the charge storage layer.

Figure 10:
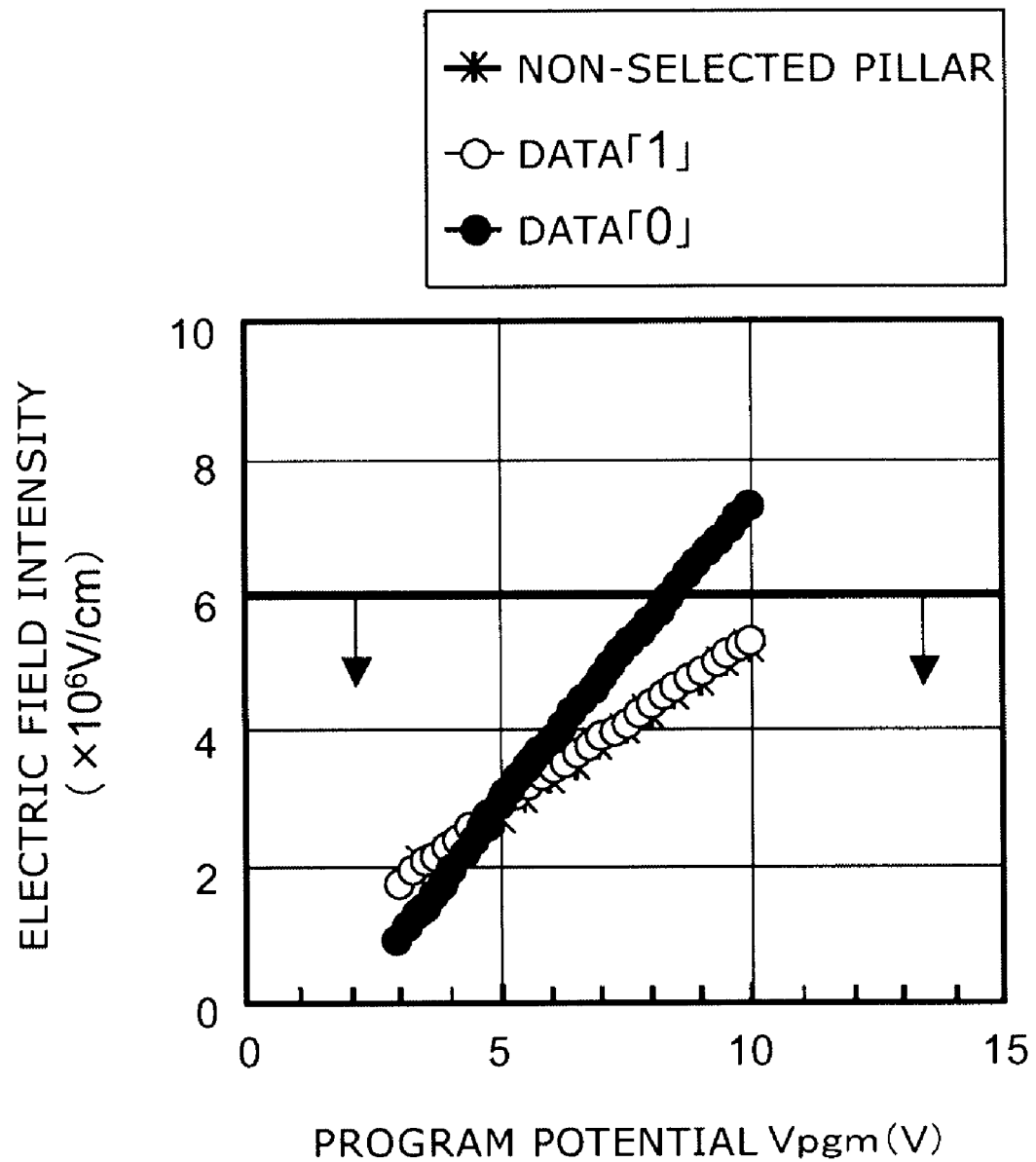
FIG. 10 is a graph illustrating degree of error-writing by FN tunnel current.

FIG. 10 is a graph illustrating degree of error-writing by FN tunnel current, in which the horizontal axis represents value of the program potential Vpgm and the vertical axis represents intensity of the electric field applied to the charge storage layer that is not the selected charge storage layer in the selected cell.

As shown in FIG. 8, a charge storage layer 33-1 disposed on the source line side by one as seen from the selected charge storage layer 33-0, namely, the charge storage layer 33-1 on the bit line side in the memory cell disposed on the source line side by one as seen from the selected cell is located between the electrode film WL-0 having the potential of Vdd and the electrode film WL-1 having the potential of 0V, and thus, it is thought that electrons are injected thereinto by HCI as well as the selected charge storage layer 33-0.

However, as shown in FIG. 9, as a result of the simulation, it was revealed that the amount of electrons injected into the adjacent charge storage layer 33-1 is smaller than the amount of electrons injected into the selected charge storage layer 33-0 by 2 to 5 digits. Therefore, when the data "0" is written to the selected charge storage layer 33-0, electrons of the effective amount are not injected into the charge storage layer 33-1, and error-writing is not caused.

Moreover, as shown in FIG. 8, a charge storage layer 33-2 disposed on the bit line side by one as seen from the selected charge storage layer 33-0, namely, the charge storage layer on the bit line side belonging to the selected cell is disposed in a position departing from the position on which the electric field concentrates, and thus, injection of electrons by HCI is not caused. However, because electric field is formed between the charge storage layer 33-2 and the silicon pillar, electrons can be injected into the charge storage layer 33-2 by FN tunnel current through the tunnel insulating layer 31 from the silicon pillar SP.

Accordingly, by discussing this, in the example of the simulation shown in FIG. 8, it is necessary that the electric field of $6 \times 10^6$ V/cm or more is being generated between the charge storage layer 33-2 and the silicon pillar SP in order for electrons to be injected into the charge storage layer 33-2 by the FN tunnel current. However, as shown in FIG. 10, as the result of the simulation, it was revealed that when the program potential Vpgm is approximately 5 V, the electric field between the charge storage layer 33-2 and the silicon pillar SP does not reach $6 \times 10^6$ V/cm. Therefore, when the data is written in the selected charge storage layer 33-0, electrons are not injected into the charge storage layer 33-2 located next thereto on the bit line side, and error-writing is not caused.

As described above, according to this writing method, data are not error-written in the charge storage layers 33-1 and 33-2 of the both adjacent sides of the selected charge storage layer 33-0, and data can be written in an optional selected charge storage layer 33-0.

And, as shown in FIG. 7A, for example, the potential of each of electrode films WL is raised from 0V to the program potential Vpgm one by one sequentially from the electrode film WL on the bit line BL side and therewith the potential of the bit line BL is controlled, and thereby, for all of the memory cells provided in the selected pillar, data can be written sequentially in the charge storage layers on the source line sides as seen from the electrode films WL.

Moreover, as shown in FIGS. 6 and 7B, in the case of writing data in the charge storage layers 33 on the bit line sides in the respective memory cells, the roles of the bit line BL and the source line SL are interchanged, and the roles of the upper selective gate USG and the lower selective gate LSG are interchanged.

That is, the upper selective transistor is set to be OFF state by setting the potential of the upper selective gate USG to be 0V, and the lower selective transistor is set to be ON state by setting the potential of the lower selective gate LSG to be the potential Vdd, and therewith, the potential of the electrode films WL of the selected cell and the memory cells located on the source line SL side from the selected cell are set to be the program potential Vpgm, and the potential of the electrode films WL of the memory cells located on the bit line BL side from the selected cell is set to be 0V. Moreover, the potential of the bit line BL is set to be 0V, and the potential of the source line SL is controlled by the value of data to be written in the selected charge storage layer. For example, in the case of writing data "0", the potential is set to be Vdd, and in the case of writing data "1", the potential is set to be 0V.

And, the potential of each of electrode films WL is set from 0V to the program potential Vpgm one by one sequentially from the source line SL side, and thereby, for all of the memory cells provided in the selected pillar, data can be written sequentially in the charge storage layers on the bit line sides as seen from the electrode films WL.

When the writing operation described above is generally expressed, the expression is as follows.

The stacking number of the electrode films WL provided in the device 1 is set to be n. n is an integer of two or more. In this case, n memory cells come to be provided in each of the silicon pillar SP. And, data "0" is to be written in the charge storage layer 33 (selected charge storage layer) on the other side (source side) in the memory cell (selected cell) of the number k as counted from one end (for example, the end of bit line side) in an optional silicon pillar SP (selected pillar). k is an integer of 1 to (n−1).

In this case, a relatively high potential (program potential Vpgm) is given to the electrode films WL of the number 1 to k as counted from the one end (the end of bit line side) in the selected pillar, and a relatively low potential (0V) is given to the electrode films WL of the number (k+1) to n, and therewith, potential of the one end (the end of bit line side) of the selected pillar is set to be higher than the other end (the end of source line side). For example, the potential of the bit line is set to be the potential Vdd and the potential of the source line is set to be 0V. Thereby, electrons are injected into the selected charge storage layer.

In the case of k=n, namely, in the case of injecting the data "0" into the charge storage layer of the memory cell located on the other end of the selected pillar, the potential of all of the electrode films WL are set to be the program potential Vpgm. Thereby, an electric field is generated between the memory cell and the other end of the selected pillar, and electrons are injected by HCI.

Next, a method for erasing data will be described.

Figure 11A:
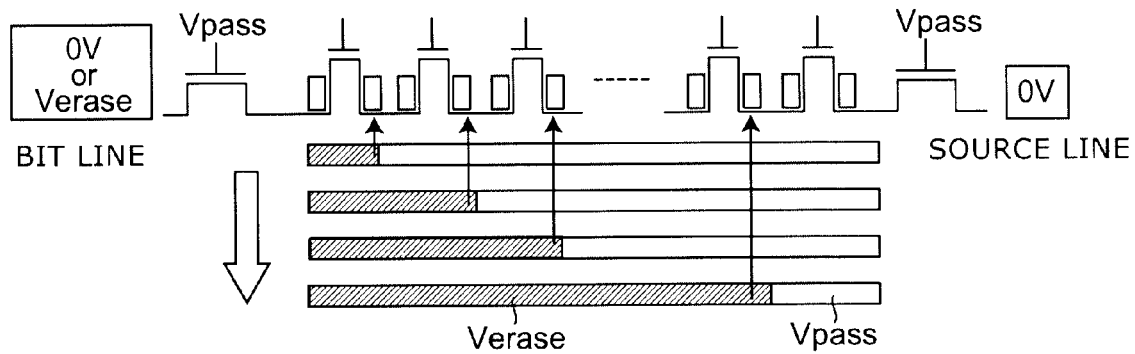
FIGS. 11A and 11B are views illustrating the erasing method according to this embodiment.
Figure 11B:
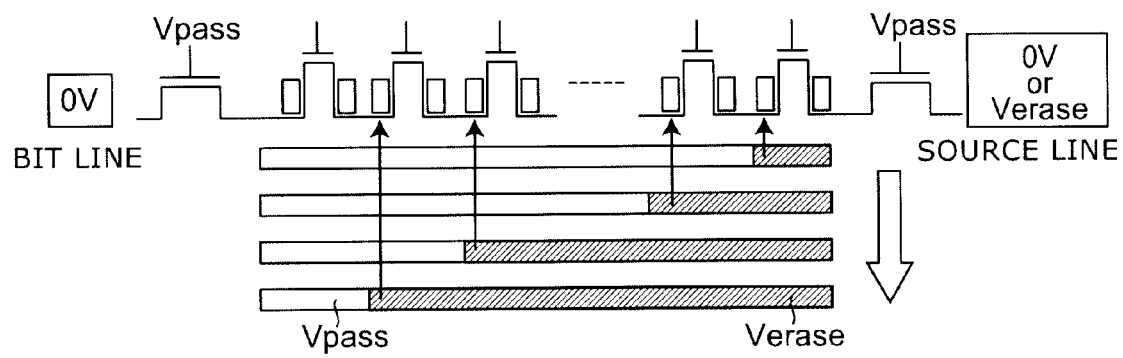

FIGS. 11A and 11B are views illustrating the erasing method according to this embodiment. FIG. 11A shows the case of erasing data written in the charge storage layer on the source side as seen from the electrode film in each of the memory cells, and FIG. 11B shows the case of erasing data written in the charge storage layer on the bit line side.

First, as shown in FIGS. 6 and 11A, in each of the memory cells, the case of erasing data from the charge storage layer 33 located on the source line side as seen from the electrode film WL will be described.

First, the charge storage layer to be erased (selected charge storage layer) is selected. And, the potential of the upper selective gate USG and the lower selective gate LSG intersecting with the silicon pillar SP (selected pillar) passing through the memory cell (selected cell) to which the selected charge storage layer belongs are set to be the potential Vpass that is lower than 0V. Thereby, the upper selective transistor and the lower selective transistor of the selected pillar are turned OFF state for electrons and are turned into ON state for holes. In this case, all of the potential of the upper selective gates USG and the lower selective gates LSG passing through silicon pillars other than the selected pillar are set to be 0V. Thereby, the upper selective transistors and the lower selective transistors of the silicon pillars other than the selected pillar are turned into OFF state for both of electrons and holes.

Moreover, the potential of the electrode films WL of the selected cell and the memory cells disposed on the bit line BL side from the selected cell are set to be erasing potential Verase. The erasing potential Verase is potential lower than the potential Vpass. That is, 0>Vpass>V erase is satisfied. On the other hand, the potential of the electrode films WL of the memory cells disposed on the source line side SL from the selected sell are set to be Vpass.

In this state, the potential of the bit line BL connected to the selected pillar is controlled in accordance with the written data in the selected charge storage layer. For example, in the case where the data "0" have been written in the selected charge storage layer, the potential of the bit line BL is set to be the erasing potential Verase. In the case where the data "1" have been written, the potential of the bit line BL is set to be 0V. Moreover, the potential of the source line SL connected to the selected pillar is set to be 0V independently from the value of the written data.

Thereby, in the case where the data "0" have been written in the selected charge storage layer, an electric field in which the bit line BL side is a negative pole and the source SL side is a positive pole is formed in the selected pillar. As a result, an electric field in which the polarity of the electric field shown in FIG. 8 is reversed is generated in the selected pillar. Therefore, holes generated by interband tunneling are injected into the selected charge storage layer and bind to the electrons stored in the selected charge storage layer and thereby lead to pair annihilation. Thereby, the data "0" written in the selected charge storage layer changes to the data "1".

On the other hand, in the case where the data "1" have been written in the selected charge storage layer, the potential of the source line SL and the potential of the bit line BL are 0V, and thus, the electric field in the Z direction is not formed in the selected pillar, and the inter-band tunneling does not occur. Hence, holes are not generated. Therefore, the written data "1" remains so.

As described above, data of all of the charge storage layers to be erased can be set to be "1". Thereby, the data is initialized and erased. In this case, likewise the above writing operation, error-erasing in the charge storage layers 33 disposed in the vicinity of the selected charge storage layer is not caused.

And, as shown in FIG. 11A, the potential of each of electrode films WL is decreased from the potential Vpass to the erasing potential Verase one by one sequentially from the bit line BL side and therewith the potential of the bit line BL is controlled, and thereby, data written in the charge storage layers 33 on the source line sides as seen from the electrode films WL can be erased sequentially for all of the memory cells provided in the selected pillar.

Moreover, as shown in FIGS. 6 and 11B, in the case of erasing data from the charge storage layers 33 on the bit line sides in the respective memory cells, the roles of the bit line BL and the source line SL are interchanged. That is, the potential of the upper selective gate USG and the lower selective gate LSG are set to the potential Vpass and thereby the upper selective transistor and the lower selective transistor are set to be ON state for holes, and therewith, the potential of the electrode films WL of the selected cell and the memory cells on the source line SL side from the selected cell are set to be the erasing potential Verase, and the potential of the electrode films WL of the memory cells on the bit line BL side from the selected cell is set to be the potential Vpass. Moreover, the potential of the bit line BL is set to be 0V, and the potential of the source line SL is controlled by the value of data to the selected charge storage layer. For example, in the case where the data "0" have been written, the potential is set to be the erasing potential Verase, and in the case where the data "1" have been written, the potential is set to be 0V.

And, the potential of each of electrode films WL is decreased from the potential Vpass to the erasing potential Verase one by one sequentially from the source line SL side, and thereby, data written in the charge storage layers on the bit line sides as seen from the electrode films WL can be erased for all of the memory cells provided in the selected pillar.

When the erasing operation described above is generally expressed, the expression is as follows.

As described above, the stacking number of the electrode films WL provided in the device 1 is set to be n. n memory cells come to be provided in each of the silicon pillar SP. And, for the memory cell (selected cell) of the number k as counted from one end (for example, the end of bit line side) in an optional silicon pillar SP (selected pillar), data "0" written in the charge storage layer 33 (selected charge storage layer) in the other side (source side) is changed to data "1".

In this case, relatively low potential (erasing potential Verase) is given to the electrode films WL of the number 1 to k as counted from the one end (the end of bit line side) in the selected pillar, and relatively high potential (potential Vpass) is given to the electrode films WL of the number (k+1) to n, and therewith, potential of the one end (the end of bit line side) in the selected pillar is set to be lower than potential of the other end (the end of source line side). For example, the potential of the bit line is set to be the potential Verase and the potential of the source line is set to be 0V. Thereby, holes are injected into the selected charge storage layer.

Next, a method for reading data will be described.

Reading of data is performed by detecting whether electrons are stored in the charge storage layer. In this embodiment, three kinds of the reading methods will be described.

First, a first reading method will be described.

Figure 12:
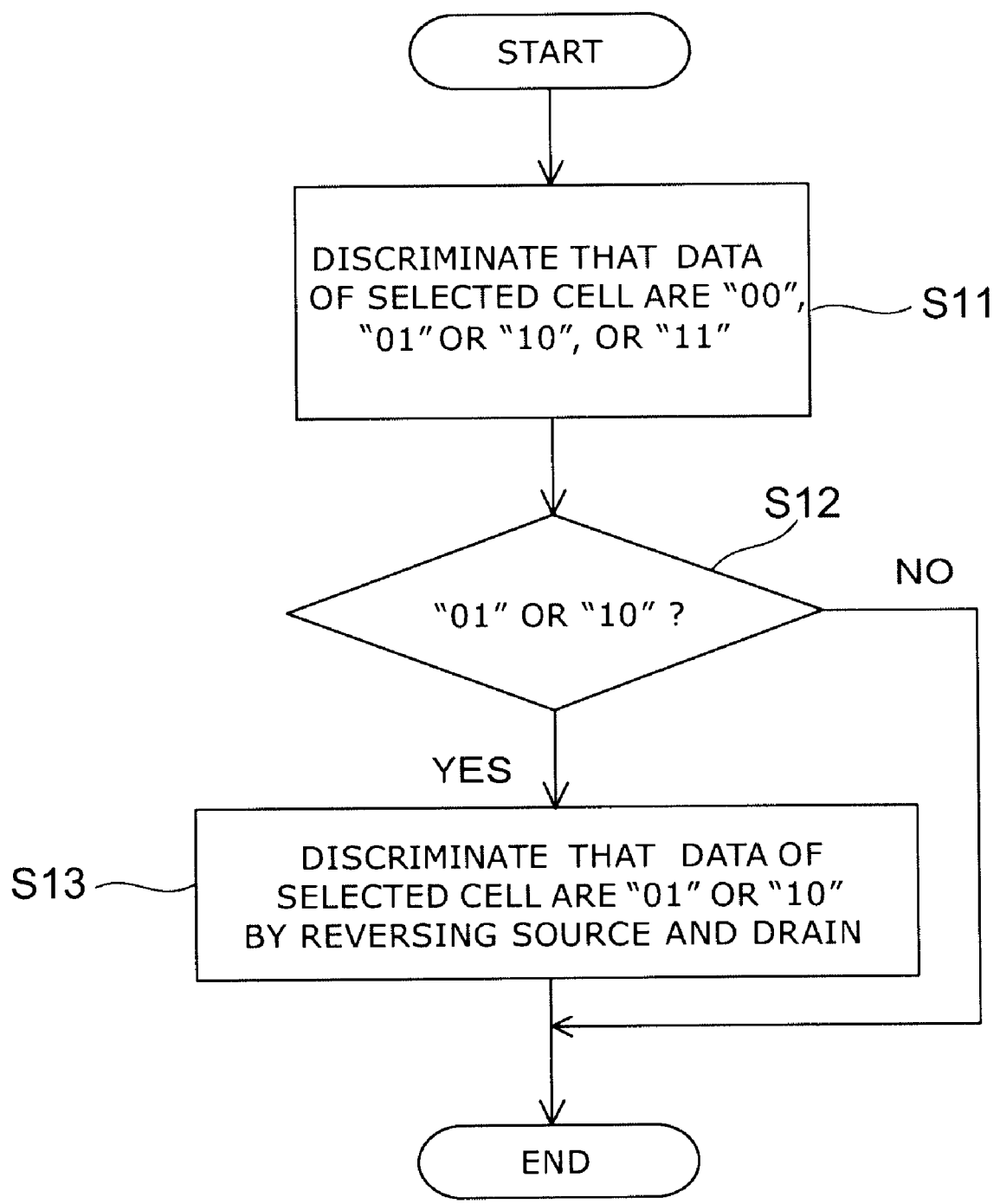
FIG. 12 is a flow chart illustrating the first reading method according to this embodiment.

FIG. 12 is a flow chart illustrating the first reading method according to this embodiment.

FIG. 13 is a graph illustrating distribution of threshold voltage of a cell transistor in Step S11 of FIG. 12, in which the horizontal axis represents the threshold voltage of the cell transistor and the vertical axis represents the number of bits.

Figure 14:
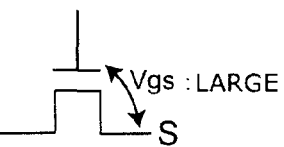
FIG. 14 is a view illustrating change of the threshold voltage in transferring from Step S11 to Step S13 shown in FIG. 12.

FIG. 14 is a view illustrating change of the threshold voltage in transferring from Step S11 shown in FIG. 12 to Step S13.

In FIG. 14, "S" represents the source and "D" represents the drain. This is the same in FIG. 18 to be described later.

First, as shown in Step S11 of FIG. 12, it is discriminated that the data "00", the data "01" or "10", or the data "11" are written in the selected cell.

As shown in FIG. 13, the threshold voltage of the cell transistor in which the data "00" are written is relatively high, and the threshold voltage of the cell transistor in which the data "11" is written is relatively low, and the threshold voltage of the cell transistor in which the data "01" or "10" are written is middle thereof. Therefore, appropriate reading potential of a first level or a second level is given to the electrode film WL serving as the control gate electrode of the selected cell, and thereby, the above discrimination can be performed. The reading potential Vread is the following potential. When the potential is given to the electrode film of the selected cell, the conducting state of the cell transistor is different according to whether electrons are stored in the charge storage layer of the selected cell, and thereby, the resistance value of the part corresponding to the selected cell in the selected pillar is different.

Specifically, as shown in FIG. 6, the potential Vdd is given to the upper selective gate USG and the lower selective gate LSG intersecting the selected pillar and thereby the upper selective transistor and the lower selective transistor of the selected pillar are set to be ON state. Moreover, the reading potential Vread is given to the electrode film WL serving as the control gate electrode of the selected cell. On the other hand, the ON potential Vdd by which each of the cell transistors is turned into ON state is given to the electrode films WL of the memory cells other than the selected cell in the selected pillar.

In this state, higher potential is given than the source line SL connected to the selected pillar to the bit line BL connected to the selected pillar. Thereby, the higher potential is given to the end on the bit line BL side of the selected pillar than the end on the source line side thereof. In this case, according to data written in the cell transistor, resistance of the selected pillar is different and magnitude of sense current flowing through the selected pillar is different. Therefore, by detecting the sense current, it can be discriminated that electrons are stored in both of the one pair of charge storage layers 33 of the selected cell (data "00") or that electrons are stored in only one of the both thereof (data "01" or "10") or that electrons are not stored in the both thereof (data "11"). In this step, the data "01" and the data "10" cannot be discriminated.

Next, as shown in Step S12 of FIG. 12, whether the data written in the selected cell are "01" or "10" or not is determined, and if the data are "01" or "10", Step S13 is performed.

In Step S13, it is discriminated that the data "01" is written in the selected cell or that the data "10" is written. The discrimination is performed through reversing the source and drain of the selected cell while holding the potential of the upper selective gate USG, the lower selective gate LSG, and each of the electrode films WL to be the same as Step S11. That is, as shown in FIG. 6, higher potential is given the bit line connected to the selected pillar, the higher potential is higher than potential given to the source line connected to the selected pillar.

By reversing the source and drain of the selected cell, the threshold voltage of the selected cell increases or decreases according to the data written in the selected cell. Hereinafter, this reason will be described.

As shown in FIG. 14, when electrons are stored in the charge storage layer, resistance is added to the side on which the charge storage layer is disposed in the gate (electrode film)-source and the gate-drain of the cell transistor. The conducting state of the cell transistor is determined by the voltage Vgs between the gate and the source. However, if the resistance is added between the gate and the source, the effective gate-source voltage Vgs decreases by resistance division. And, as a result, the threshold voltage Vth increases. On the other hand, when the resistance is added between the gate and drain, the effective gate-drain voltage decreases, but the effective gate-source voltage Vgs does not change, and thus, the threshold voltage Vth does not change. Thereby, if the charge storage layer in which electrons are stored is disposed on the source side, the threshold voltage Vth becomes larger than that of the case where the charge storage layer in which electrons are stored is disposed on the drain side.

And, in Step 11 of FIG. 12, the bit line side is the drain and the source line side is the source, and in Step S13, the bit line side is the source and the source line side is the drain. Thus, as shown in FIG. 14, if the data of the selected cell are "01", when transfer from Step S11 to Step S13 is performed, the gate-source voltage Vgs decreases and the threshold voltage Vth increases. Therefore, if the reading potential Vread is constant, the current (drain current) flowing through the selected pillar decreases. On the other hand, if the data of the selected cell are "10", when transfer from Step S11 to Step S13, the gate-source voltage Vgs increases and the threshold voltage Vth decreases. Therefore, if the reading potential Vread is constant, the current (drain current) flowing through the selected pillar increases. As described above, when transfer from Step S11 to Step S13, it can be discriminated that the data written in the selected cell are "01" or "10" by detecting that the current flowing through the selected pillar decreases or increases, and thereby.

When the first reading method is generally expressed, the expression is as follows.

As described above, the stacking number of the electrode films is set to be n, and the selected cell to be read is set to be the memory cell of the number k as counted from one end (for example, the end of bit line side) in the selected pillar. k is an integer of 1 to n.

In Step S11, reading potential Vread by which a resistance value of a part corresponding to the electrode film of the number k in the selected pillar is different according to whether electrons are stored in the charge storage layers on both sides of the electrode film of the number k is given to the electrode film of the number k as counted from the one end in the selected pillar. ON potential by which parts corresponding to the electrode films other than the electrode film of the number k in the selected pillar is turned into ON state is given to the electrode films other than the electrode film of the number k. And, in the state thereof, higher potential is given to the one end (the end of the bit line side) of the selected pillar than f the other end (the end of the source line side) to detect current flowing through the selected pillar, and thereby, it is discriminated that electrons are stored in both of the one pair of the charge storage layers disposed on both sides of the electrode film of the number k or that electrons are stored in only one of the both thereof or that electrons are not stored in the both thereof;

In the Step S12, the case where electrons are stored in only one of the one pair of charge storage layers of the selected cell is extracted.

In Step 13, when electrons are stored in only one of the one pair of charge storage layers of the selected cell, while holding the above state, higher potential is given to the other end (the end of the source line side) of the selected pillar than the one end (the end of the bit line side) to detect current flowing through the selected pillar, and thereby, it is discriminated that electrons are stored in the charge storage layer in the one end side (the bit line side) as seen from the electrode film of the number j in the one pair of charge storage layers or that electrons are stored in the charge storage layer in the other end side (the source line side) thereof.

As described above, according to the first reading method, two bits data written in each of the memory cells can be read.

Next, a second reading method will be described.

Figure 15:
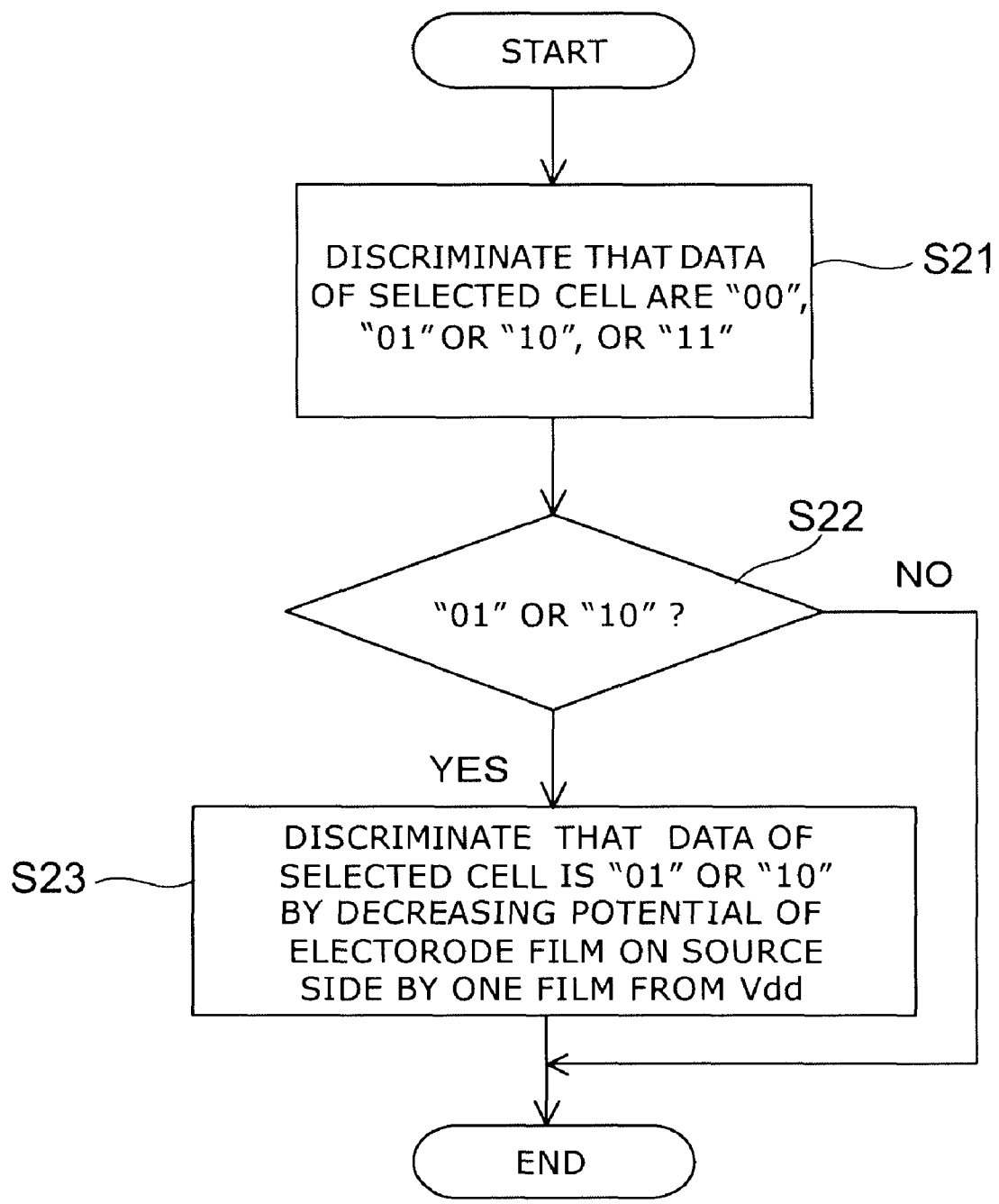
FIG. 15 is a flow chart illustrating the second reading method according to this embodiment.

FIG. 15 is a flow chart illustrating the second reading method according to this embodiment.

Figure 16:
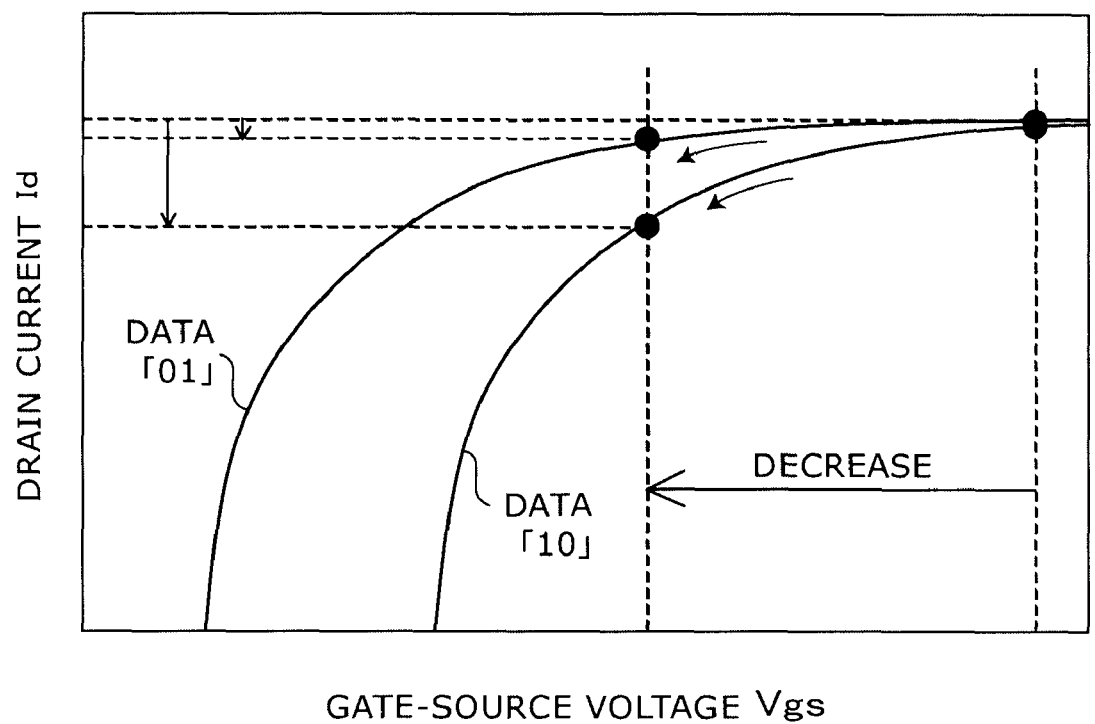
FIG. 16 is a graph illustrating states of the cell transistor.

FIG. 16 is a graph illustrating states of the cell transistor, in which the horizontal axis represents gate-source voltage Vgs and the vertical axis represents source-drain current Id.

First, as shown in Step S21 of FIG. 15, it is discriminated that the data "00", the data "01" or "10", or the data "11" are written in the selected cell. The operation of Step S21 is the same as the operation of Step S11 (see FIG. 12) in the above first reading method.

Next, as shown in Step S22 of FIG. 15, whether the data written in the selected cell are "01" or "10" or not is determined, and if the data are "01" or "10", Step S23 is performed.

In Step S23, it is discriminated that the data "01" is written in the selected cell or that the data "10" is written. The discrimination is performed by slightly decreasing the potential of the electrode film WL of the memory cell on the source line side by one as seen from the selected cell to be the potential between the ON potential Vdd and the reading potential Vread. In this case, each of potential of the other electrode films WL, the upper selective gate USG, the lower selective gate LSG, the bit line BL, and source line SL is set to remain the same potential as Step S21.

As shown in FIG. 16, by the reason described in the above first reading method, when electrons are stored in the charge storage layer on the source side (source line side), namely, when the data "10" is written, the threshold voltage is higher and the V-I curve shifts to higher potential side, compared to the case where electrons are stored in the charge storage layer on the drain side (bit line side), namely, the case where the data "01" is written.

And, when the potential of the electrode film of the memory cell on the source line side by one as seen from the selected cell is decreased from the ON potential Vdd, the resistance of the memory cell increases, and by the amount thereof, the effective gate-source voltage Vgs of the selected cell decreases. In this case, as shown in FIG. 16, when the data "01" is written, the drain current Id flowing between source and drain hardly changes, but when the data "10" is written, the drain current Id largely decreases. Therefore, by detecting the drain current Id, it can be determined that the data written in the selected cell is "01" when the drain current Id hardly changes and that the data is "10" when the current Id largely decreases.

When the second reading method is generally expressed, the expression is as follows.

Step S21 and S22 are the same as the above Step S11 and S12.

In Step 23, when electrons are stored in only one of the one pair of charge storage layers of the selected cell, reading potential Vread is given to the electrode film of the number k and potential between the ON potential Vdd and the reading potential Vread is given to the electrode film of the number (k+1) and the ON potential Vdd is given to the other electrode films, and higher potential is given to the one end (the end of the bit line side) of the selected pillar than the other end (the end of the source line side) thereof to detect current flowing through the selected pillar. Thereby, it is discriminated that electrons are stored in the charge storage layer on the one end side (bit line side) as seen from the electrode film of the number k in the one pair of charge storage layers or that electrons are stored in the charge storage layer in the other end side (source line side) thereof.

As described above, also by the second reading method, two-bit data written in each of the memory cells can be read.

Next, a third reading method will be described.

Figure 17:
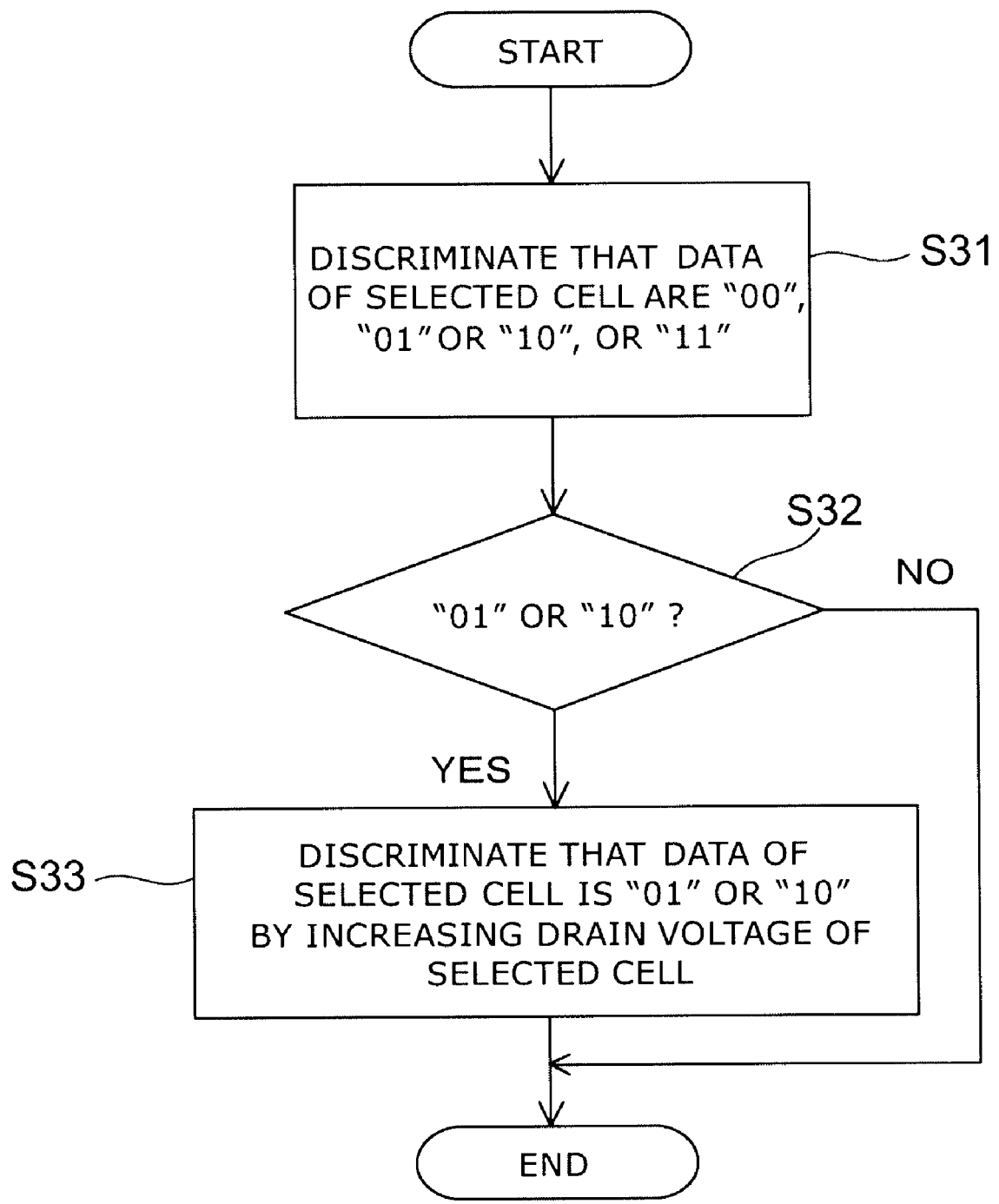
FIG. 17 is a flow charge illustrating the third reading method according to this embodiment.

FIG. 17 is a flow charge illustrating the third reading method according to this embodiment.

FIG. 18 is a view illustrating change of the threshold voltage in transferring from Step S31 shown in FIG. 17 to Step S33.

First, as shown in Step S31 of FIG. 17, it is discriminated that the data "00", the data "01" or "10", or the data "11" are written in the selected cell. The operation of Step S31 is the same as the Step S11 of the above first reading method.

Next, as shown in Step S32 of FIG. 17, whether the data written in the selected cell are "01" or "10" or not is determined, and if the data are "01" or "10", Step S33 is performed.

In Step S33, it is discriminated that the data "01" is written in the selected cell or that the data "10" is written. As shown in FIG. 6, the discrimination is performed by increasing the drain voltage of the selected cell while holding the potential of the upper selective gate USG, the lower selective gate LSG, and each of the electrode films to be the same potential as Step S31. For example, the potential of the bit line BL is raised while holding the potential of the source line SL connected to the selected pillar.

As shown in the view of the left side of FIG. 18, when the data written in the selected cell is "01", electrons are stored in the charge storage layer on the bit line side, and resistance is added to the bit line side as seen from the control gate electrode (electrode film WL).

In Step S31, for example, when the potential of the node A shown in FIG. 18 is set to be 0 V and the potential of the node B is set to be 2.5 V and the potential of the node C is set to be 5 V and the potential of the gate G is set to be 5 V, the gate-source voltage Vgs is the potential difference between the gate G and the node A and therefore is 5−0=5 V.

Next, in Step S33, for example, when the potential of the bit line is raised to increase the drain voltage, for example, the potential of the node C is set to be 6 V, the potential of the node B becomes 3 V and the potential of the node A becomes 0 V.

The potential of the gate G remains 5 V. Also in this case, the gate-source voltage Vgs is the potential difference between the gate G and the node A and therefore is 5−0=5 V. As described above, when the data is "01", if the drain voltage is increased, the gate-source voltage Vgs does not change and therefore the threshold voltage Vth does not also change.

On the other hand, as shown in the view of the right side of FIG. 18, when the data written in the selected cell is "10", electrons are stored in the charge storage layer on the source line side, and resistance is added to the source line side as seen from the control gate electrode (electrode film WL).

In Step S31, for example, when the potential of the node A is set to be 0 V and the potential of the node B is set to be 2.5 V and the potential of the node C is set to be 5 V and the potential of the gate G is set to be 5 V, the gate-source voltage Vgs is the potential difference between the gate G and the node B and therefore is 5−2.5=2.5 V.

Next, in Step S33, for example, when the potential of the bit line is raised to increase the drain voltage, for example, the potential of the node C is set to be 6 V, the potential of the node B becomes 3 V and the potential of the node A becomes 0 V. On the other hand, the potential of the gate G remains 5 V. In this case, the gate-source voltage Vgs becomes 5−3=2 V. As described above, when the data is "10", if the drain voltage is increased, the gate-source voltage Vgs decreases, and by the amount thereof, the threshold voltage Vth increases.

As described above, in Step S33, the drain voltage of the selected cell is increased from the state of the Step S31. And, by detecting the current flowing through the selected pillar, the threshold voltage Vth of the selected cell is measured. As a result, if the threshold voltage Vth does not change, the data is determined to be "01,", and if the threshold voltage increases the data is determined to be "10". When the reading potential Vread is constant, if the threshold voltage Vth does not change, the current flowing through the selected pillar does not also change, and if the threshold voltage Vth increases, the current flowing through the selected pillar decreases.

When the third reading method is generally expressed, the expression is as follows.

Step S31 and S32 are the same as the above Step S11 and S12.

In Step S33, when electrons are stored in only one of the one pair of charge storage layers of the selected cell, voltage between the one end (for example, the end of the bit line side) and the other end (the end of the source line side) of the selected pillar is increased to detect current flowing through the semiconductor pillar. Thereby, it is discriminated that electrons are stored in the charge storage layer on the one end side (bit line side) as seen from the electrode film of the number k in the one pair of charge storage layers of the memory cell (selected cell) of the number k or that electrons are stored in the charge storage layer on the other end side (source line side) thereof.

As described above, also by the third reading method, two-bit data written in each of the memory cells can be read.

As described above, according to this embodiment, the two-bit data can be written, erased, and read by the three methods in each of the memory cells.

Next, a method for manufacturing a nonvolatile semiconductor memory device according to this embodiment will be described with reference to an example.

FIGS. 19 to 25 are sectional views of steps illustrating the method for manufacturing a nonvolatile semiconductor memory device according to this example.

Figure 25:
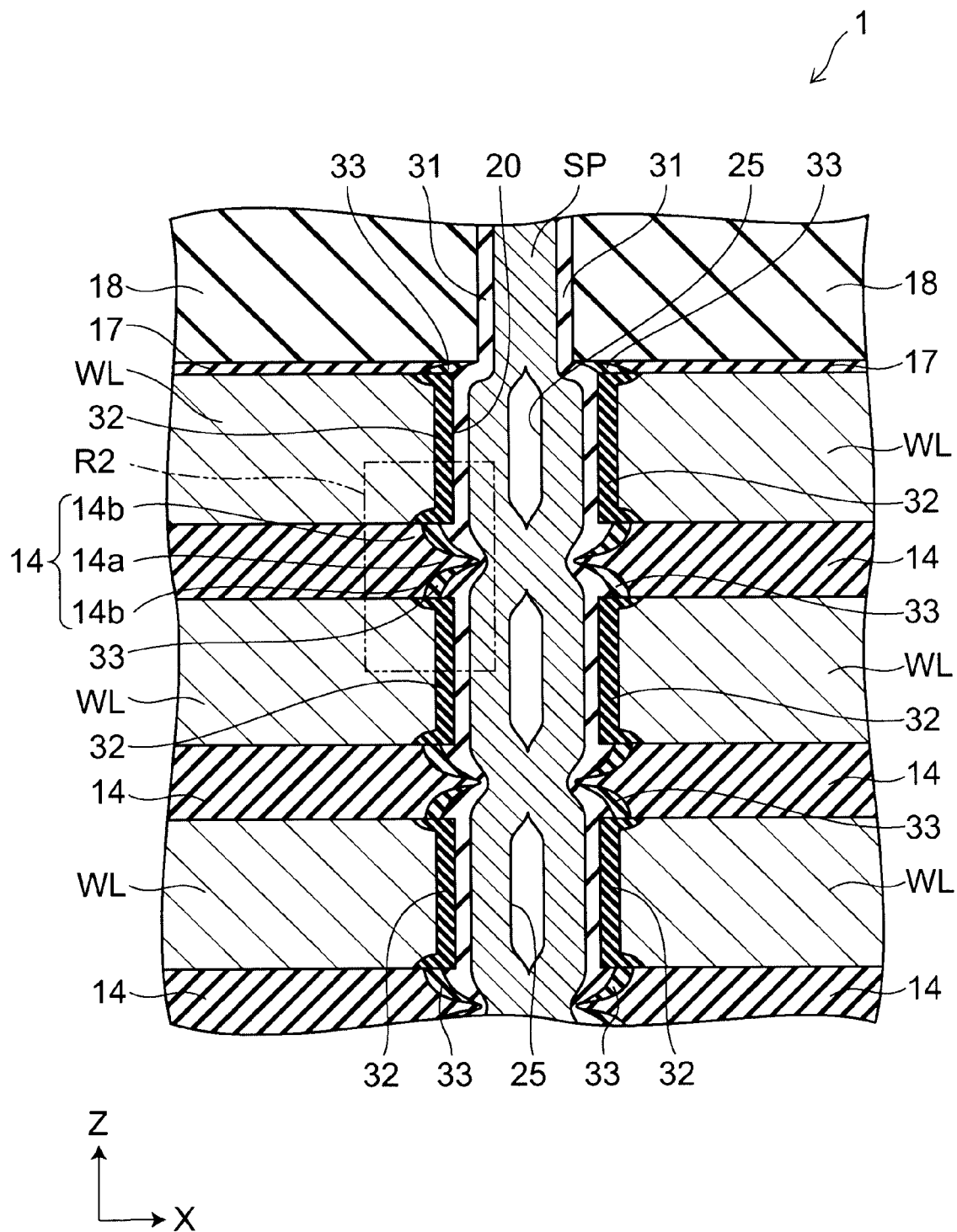
Figure 26:
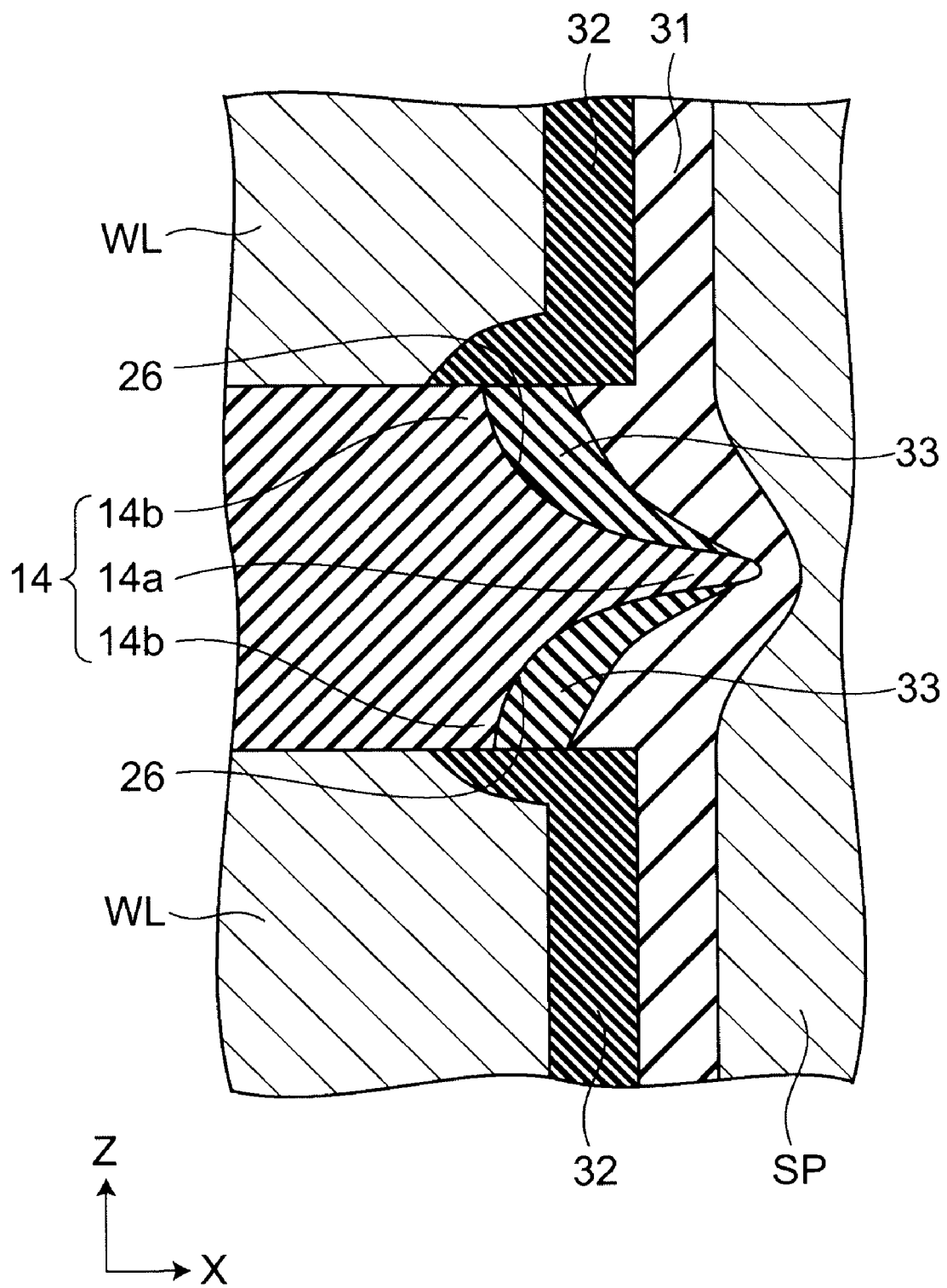
FIG. 26 is a partial expanded view of the region R2 shown in FIG. 25.

FIG. 26 is a partial expanded view of the region R2 shown in FIG. 25.

In the following description, the same signs are appended to the same components as the components shown in FIGS. 1 and 2 and will be described.

First, an element separation film (not shown) is formed in a desired position in the upper layer part of the silicon substrate 11 (see, FIG. 1). And, impurities are introduced into the memory array region to form the source line SL (see, FIG. 1). The source line SL may be composed of a diffusion layer having a wire structure separated electrically by the element separation structure or by a metal wire buried in the silicon substrate 11. In both cases, it is necessary that the source line SL has a wire structure having the same arrangement period and extending in the same direction as the bit line BL (see, FIG. 1). On the other hand, in the circuit region (not shown), P well and N well and so forth are formed, and the source and the drain of the transistor composing each of the driver circuits are formed. Next, the gate of the transistor is formed.

Next, the insulating film 12 (see, FIG. 2) is formed by depositing and flattening an insulating material on the memory array region on the silicon substrate 11. Next, for example, amorphous silicon is deposited on the insulating film 12 to form the lower selective gate LSG (see, FIG. 2). Next, the insulating film 13 (see, FIG. 2) is formed on the lower selective gate LSG. Thereby, the lower gate stacked body composed of the insulating film, the lower selective gate, and the insulating film is formed.

Next, in the lower gate stacked body, through-holes 20 (see, FIG. 2) extending in the Z direction (stacking direction) and reaching the silicon substrate are formed. In this case, a plurality of through-holes 20 are formed simultaneously to be arranged in a matrix formed as seen from the Z direction. Next, for example, a silicon oxide film or silicon nitride film is deposited on the entire surface of the lower gate stacked body, and then, anisotropic etching such as RIE (Reactive Ion Etching) is performed to leave the film only on the side surfaces of the through-holes. Thereby, the lower gate insulating film 21 (see, FIG. 2) is formed.

Then, by performing a dilute hydrofluoric acid treatment, a natural oxide film or the line is removed from the bottom surfaces of the through-holes, and then, amorphous silicon is buried in the through-holes. Thereby, the lower parts of the silicon pillars SP are buried in through holes. As a result, the lower selective transistor is formed.

Figure 19:
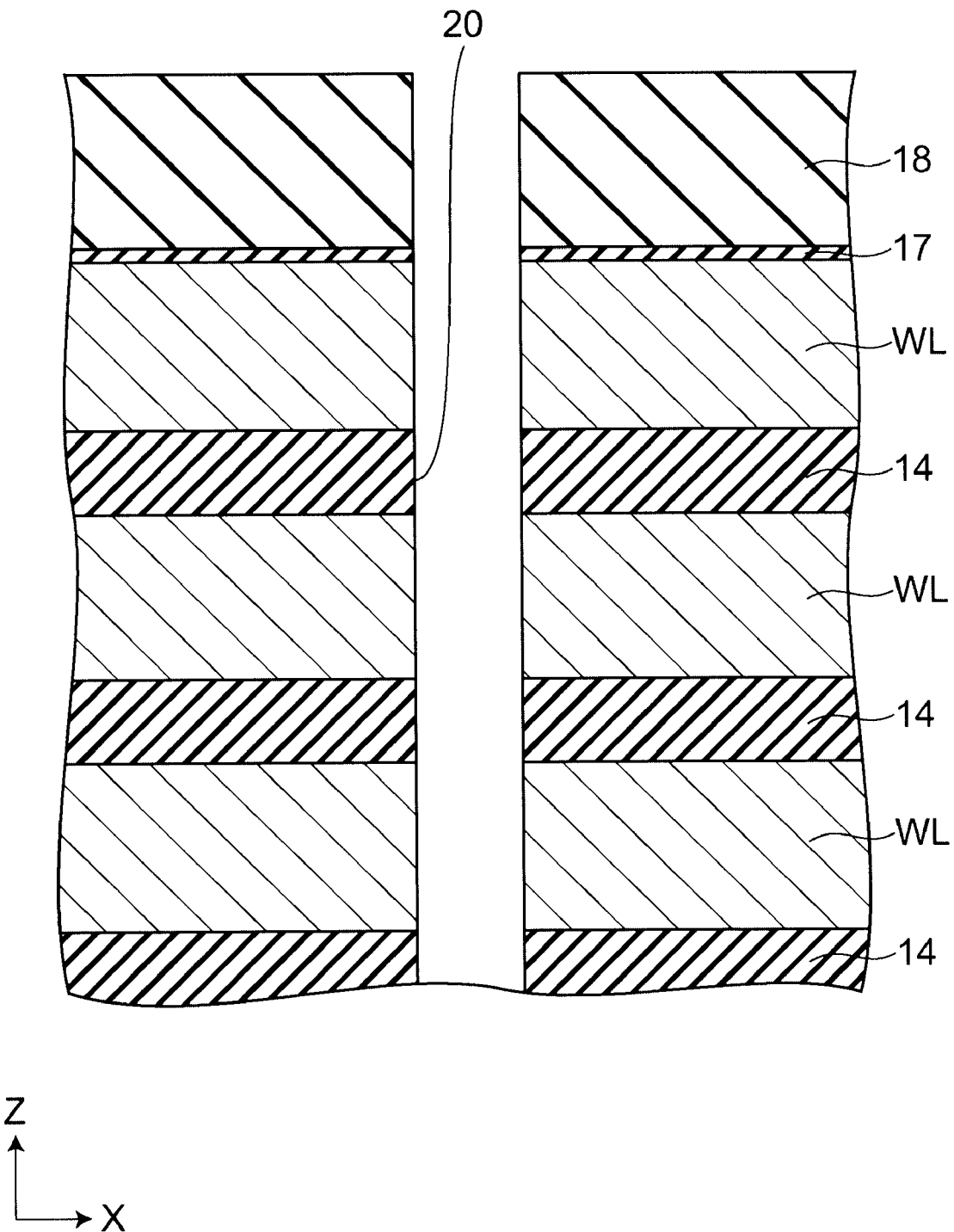
FIG. 19 is a cross-sectional view of steps illustrating the method for manufacturing a nonvolatile semiconductor memory device according to an example of this embodiment.

Next, as shown in FIG. 19, an insulating material such as silicon oxide is deposed to form the insulating film 14 on the lower gate stacked body. Next, the electrode film WL is formed on the insulating film 14. Then, the insulating films 14 and the electrode WL films are alternately stacked. In one example, four insulating films 14 and four electrode films WL are formed. Next, the silicon oxide film 17 is formed and the silicon nitride film 18 is formed. Thereby, the memory stacked body is formed.

Next, the through-holes 20 are formed in the memory stacked body by performing photolithography and RIE. The through-holes 20 reach the through-holes formed in the lower gate stacked body. In this stage, the shape of the through-hole 20 is, for example, an approximately tubular shape, and the side surfaces of the through-holes 20 have approximately straight line shapes in a section parallel to the Z direction. Moreover, in the bottom surface of the through-hole 20, the lower part of the silicon pillar SP is exposed.

Figure 20:
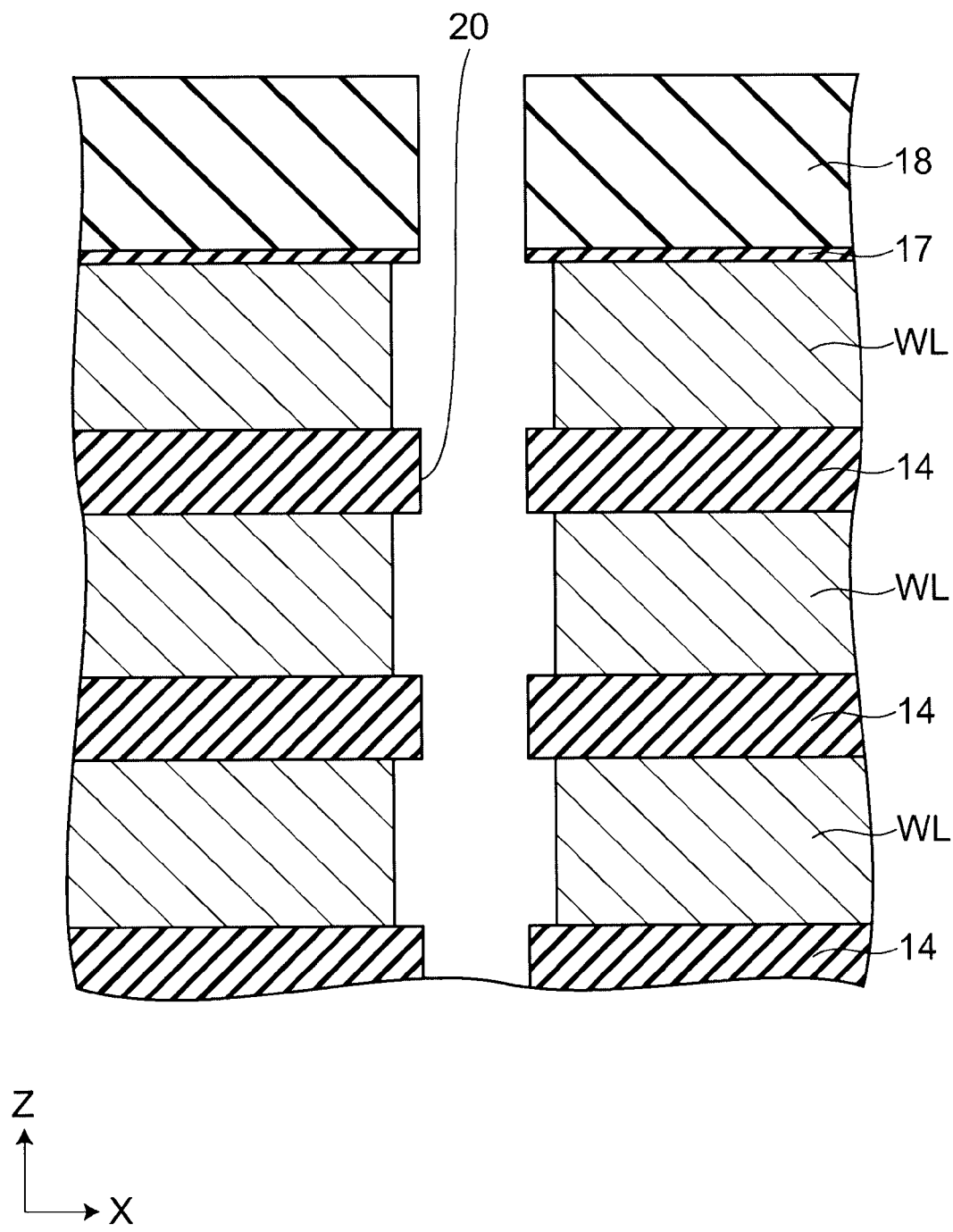
FIGS. 20 to 25 are cross-sectional views of steps illustrating the method for manufacturing the nonvolatile semiconductor memory device according to this example.

Next, as shown in FIG. 20, wet etching is performed through the through-holes 20. The condition of the wet etching is set to be the condition in which etching selection ratio of silicon with respect to silicon oxide and silicon nitride becomes high. Thereby, the electrode films WL made of amorphous silicon or poly silicon are selective etched. As a result, in the side surfaces of the through-holes 20, the electrode films WL recess with respect to the insulating films 14, and the insulating films 14 relatively stick out to the inside of the through-holes 20. In this step, instead of the wet etching, CDE (Chemical Dry Etching) may be performed.

Figure 21:
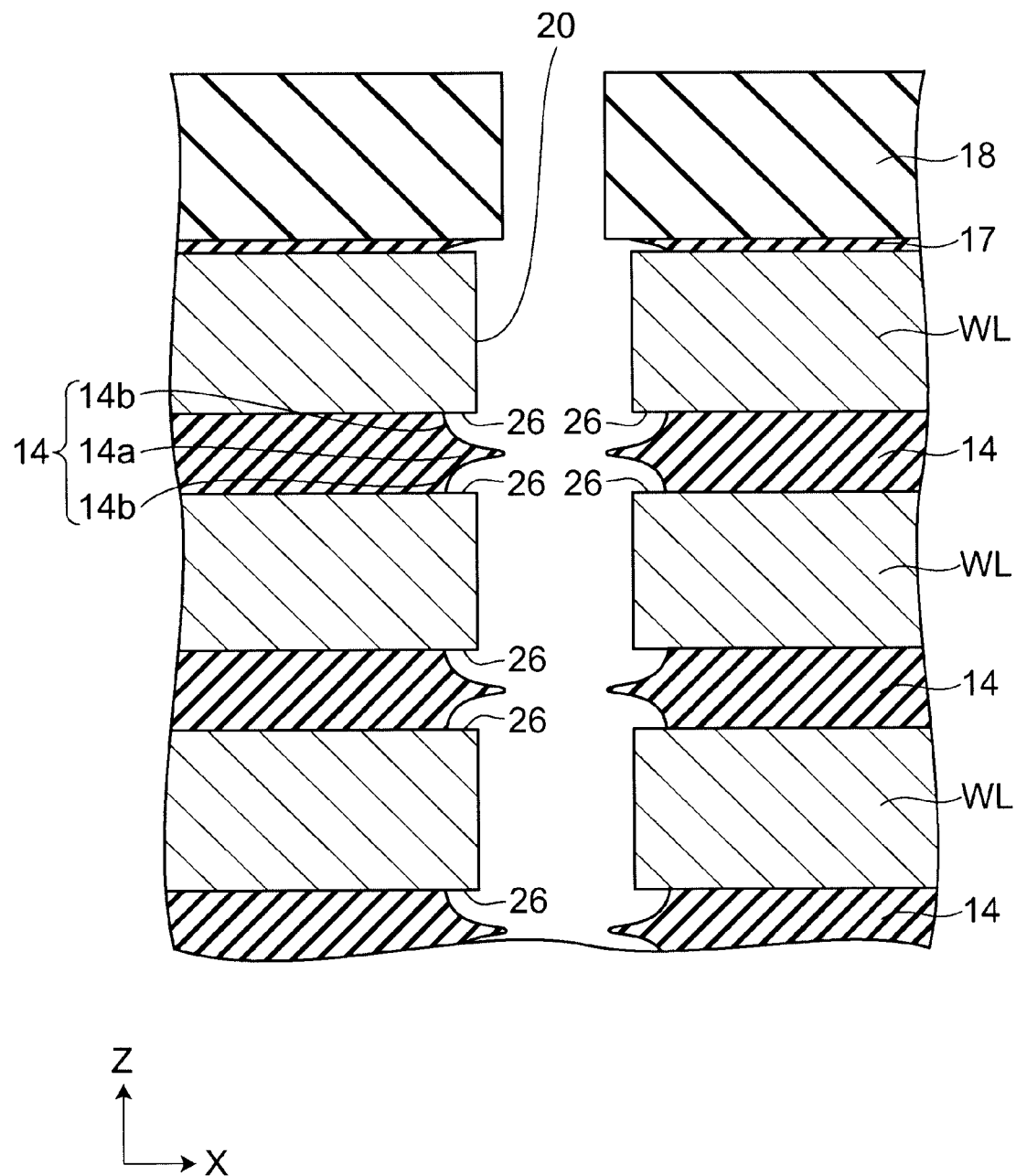

Next, as shown in FIG. 21, wet etching is performed through the through-holes 20. The condition of the wet etching is set to be the condition in which etching selection ratio of silicon oxide with respect to silicon and silicon nitride becomes high. Thereby, the insulating films 14 made of silicon oxide and the silicon oxide films 17 are isotropically etched. As a result, the parts sticking out to the inside of the through holes 20 in the insulating films 14 is entirely rounded, and the interface vicinities thereof to electrode films WL are deeply etched, and thereby, the peripheral portions 14b recessed from the electrode films WL and the central portions 14a sticking out toward the inside of the through-holes 20 from the peripheral portions 14b are formed. Thereby, in the side surfaces of the through-holes 20, concave portions 26 are formed in the boundary parts to the electrode films WL in the insulating films 14.

Figure 22:
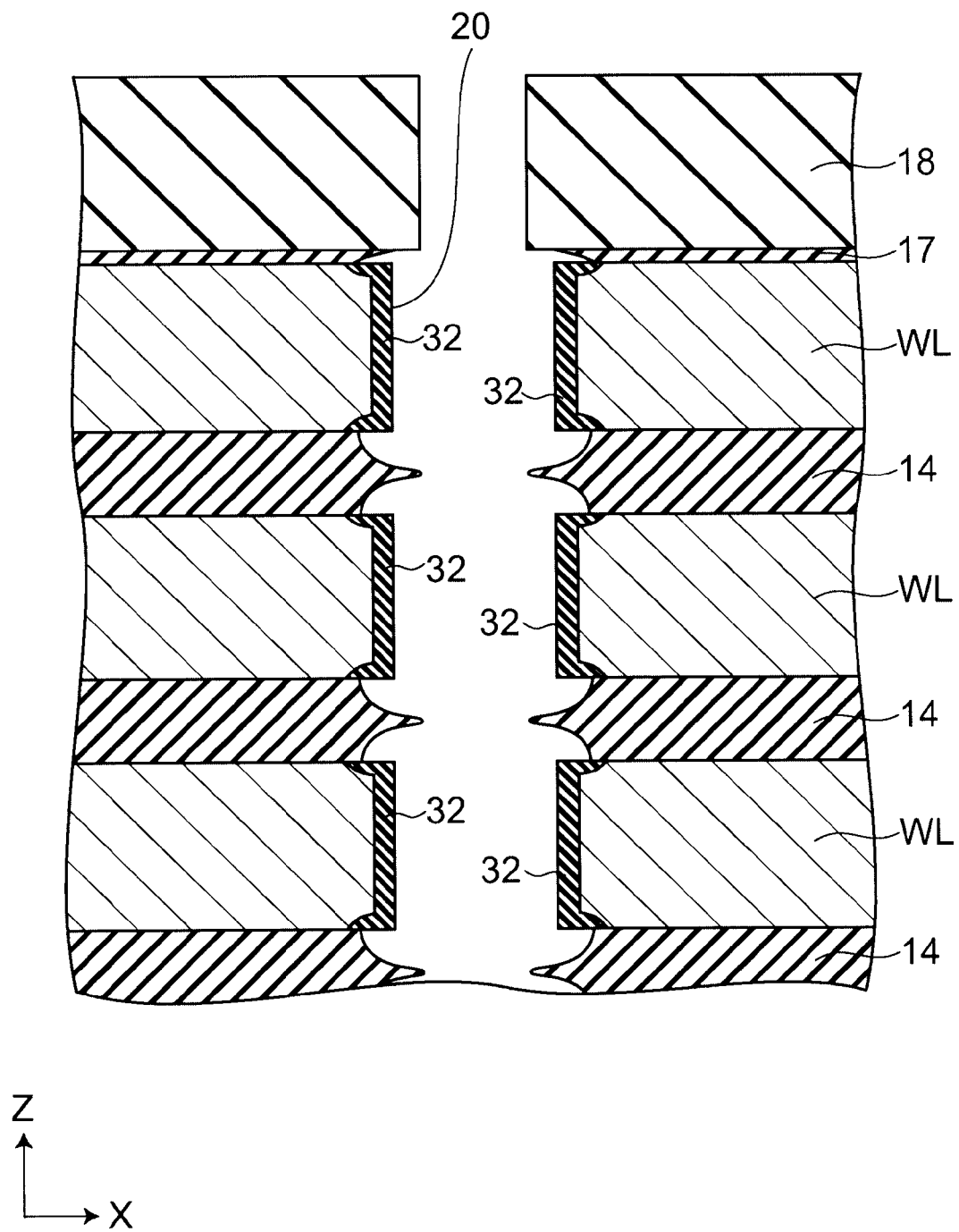

Next, as shown in FIG. 22, thermal oxidation treatment is performed. Thereby, the parts exposed to the inside of the through-holes 20 in the electrode films WL are oxidized to form the block insulating layer 32 made of silicon oxide. The block insulating layer 32 may be formed by CVD method (Chemical Vapor Deposition method). In this case, the block insulating layer 32 becomes also formed on the side surfaces of the insulating films 14, the silicon oxide film 17, and the silicon nitride film 18.

Figure 23:
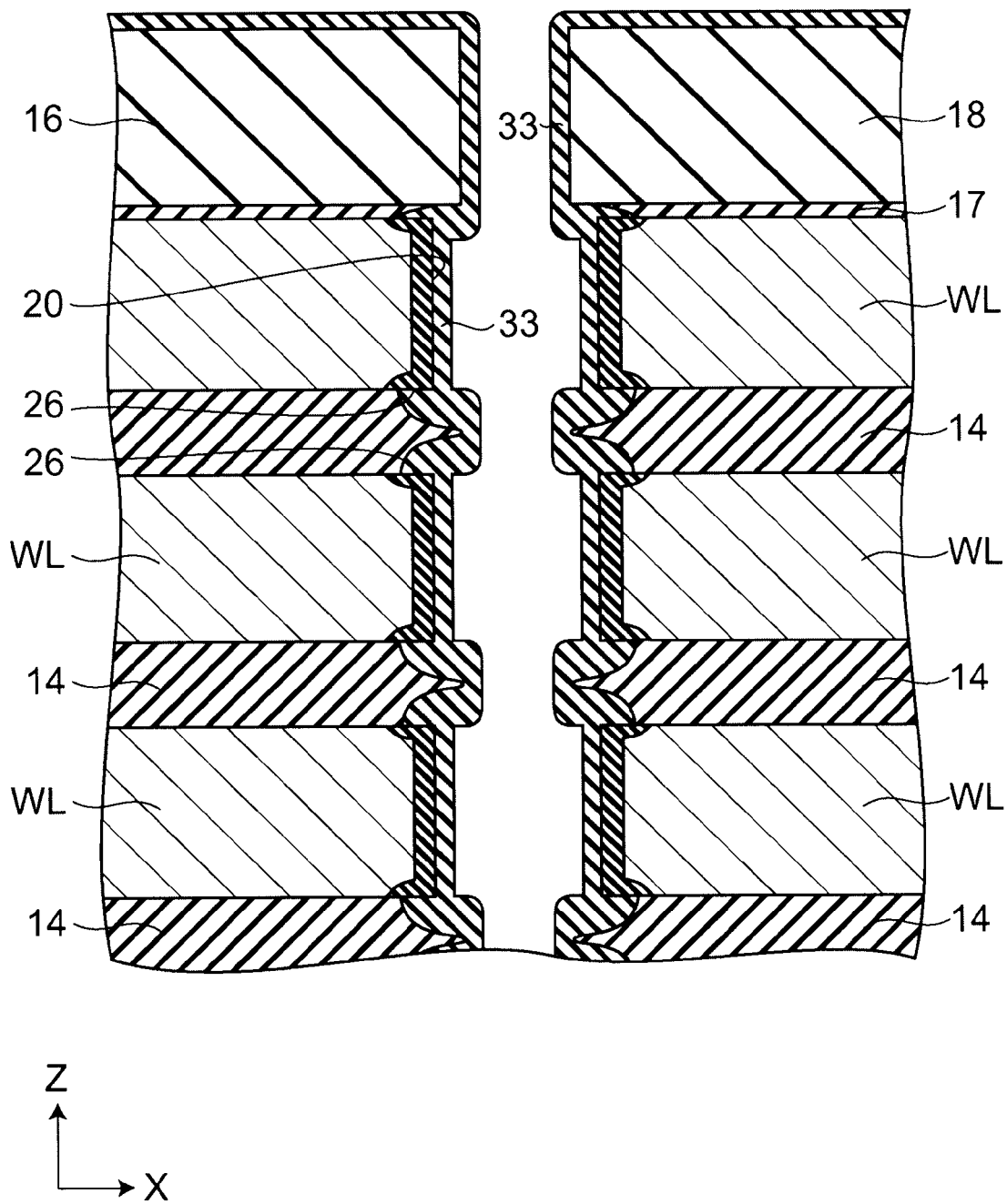

Next, as shown in FIG. 23, by depositing silicon nitride using, for example, CVD method, the charge storage layer 33 is film-formed. The charge storage layer 33 is formed on the entire surface, namely, on the side surfaces and bottom surfaces of the through-holes 20 and on the upper surface of the silicon nitride film 18. In this case, the charge storage layer 33 is also buried in the concave portions 26.

Figure 24:
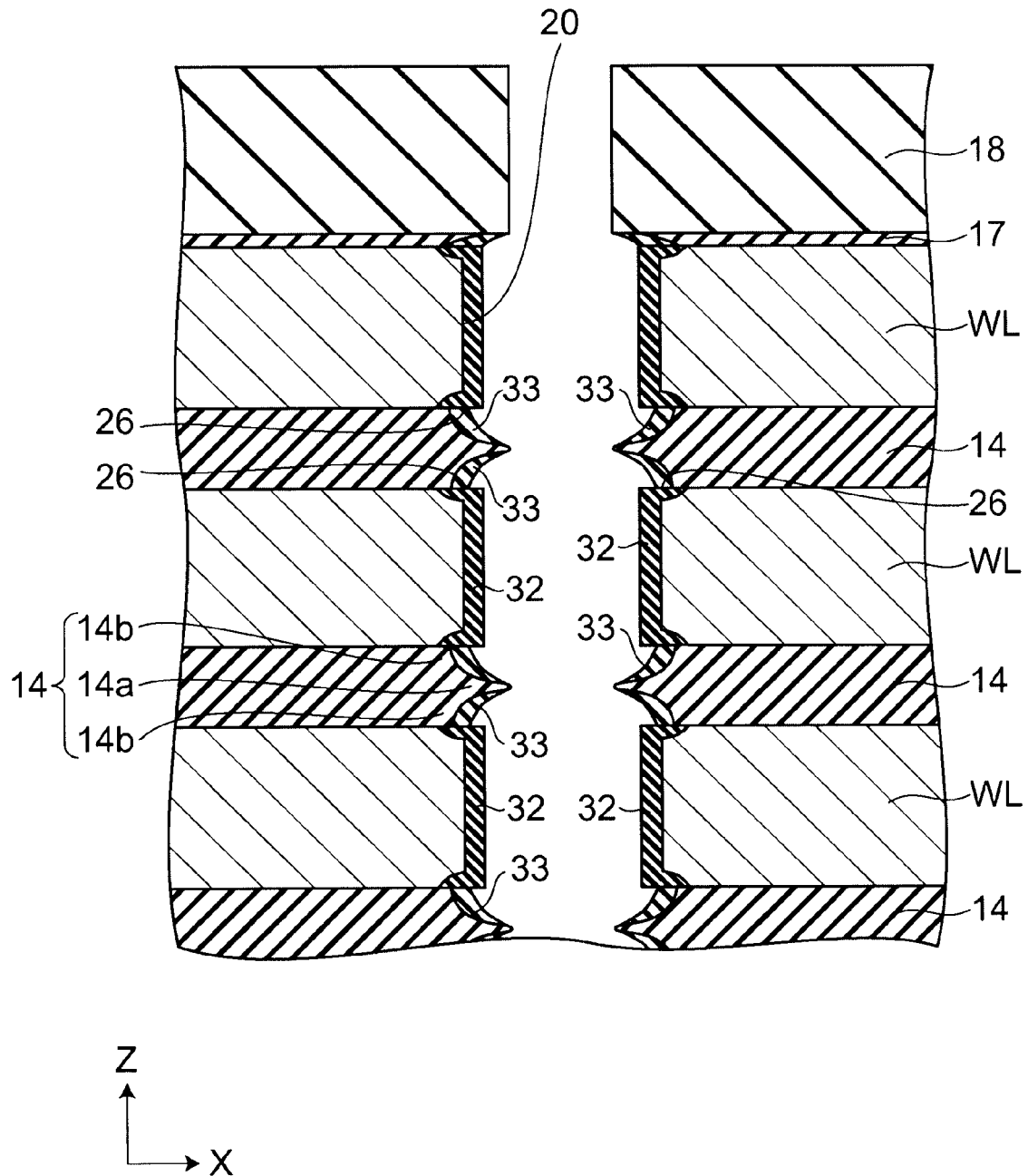

Next, as shown in FIG. 24, the charge storage layer 33 is etched by performing wet etching or CDE through the through-holes 20. Thereby, the charge storage layer 33 remains in the concave portions 26 and on the side surfaces of the silicon oxide film 17 and is removed from the other regions. That is, the charge storage layer 33 is removed from the side surfaces of the central portions 14a of the insulating films 14 and the side surfaces of the electrode films WL and the side surfaces and upper surface of the silicon nitride film 18.

Next, as shown in FIGS. 25 and 26, silicon oxide is deposited on the entire surface by, for example, CVD method to form the tunnel insulating layer 31. In this case, the tunnel insulating layer 31 is formed on the side surfaces of the block insulating layers 32 and side surfaces of the charge storage layers 33 and the side surfaces of the central portions 14a of the insulating films 14 and encompasses the charge storage layers 33 remaining in the concave portions 26.

Next, silicon is deposited and etch-backed, and thereby, a protective film (not shown) made of silicon is formed on the side surfaces and the bottom surfaces of the through-holes 20. Next, by performing etching, the protective film, the tunnel insulating layer 31 and the block insulating layer 32 which are formed on the bottom surfaces of the through-holes 20 are removed. Next, by performing a dilute hydrofluoric acid treatment, the natural oxide films formed on the upper surfaces of the lower parts of the silicon pillars SP is removed.

Next, the protective film is removed, and amorphous silicon is buried inside the through-holes 20. Thereby, the central parts of the silicon pillars SP are buried in the through-holes 20. The central parts of the silicon pillars SP are connected to the lower parts of the silicon pillars SP buried in the lower gate stacked body. In this case, by controlling the amount of the silicon to be buried, voids 25 are continuously or intermittently formed along the mid lines of the silicon pillars SP. It is also possible that by burying amorphous silicon in the entire through-holes 20, the voids 25 are not formed.

Next, an insulating film (not shown) made of, for example, silicon oxide is formed on the memory stacked body, and the upper selective gate USG (see, FIG. 1) is formed by depositing, for example, amorphous silicon, and an insulating film (not shown) made of, for example, silicon oxide is formed. Thereby, the upper gate stacked body including the upper selective gate USG is formed. Next, through-holes (not shown) are formed in the upper gate stacked body, amorphous silicon is buried in the through-holes and thereby the upper parts of the silicon pillars SP are formed. In this case, the lower part, the central part, and the upper part of the silicon pillar SP are integrally connected, and the silicon pillars SP extending in the Z direction are formed. Next, the metal film is formed on the entire surface on the upper gate stacked body and patterned, and thereby, the wires such as bit lines BL are formed. Thereby, the nonvolatile semiconductor memory device 1 is manufactured.

Next, the working effects of this embodiment will be described.

In this embodiment, the charge storage layers 33 are on the upper and lower sides of the electrode film WL and are not provided between the electrode film WL and the silicon pillar SP. That is, only the tunnel insulating layer 31 and the block insulating layer 32 are provided between the electrode film WL and the silicon pillar SP. As a result, the distance between the electrode film WL and silicon pillar SP can be short. Thereby, the outer diameter of the silicon pillar SP can be set to be an outer diameter required for flowing current through the silicon pillar SP, and the inner diameter of the through-hole 20 can be small while holding the tunnel insulating layer 31 and the block insulating layer 32 with a required film thicknesses. As a result, in the nonvolatile semiconductor memory device 1 according to this embodiment, the planar structure thereof can be finer.

Moreover, in the device 1, on the electrons stored in the charge storage layer 33, a force acts in the direction backing away from each other by the self-electric field formed by the electrons themselves. Moreover, if potential is given to the electrode film WL of the contiguous memory cell, a force due to the potential also acts on the electrons. Therefore, if there is a pathway through which the electrons stored in the charge storage layer 33 can move, the electrons can diffuse or move to disappear from the memory cell.

However, in this embodiment, the charge storage layer 33 provided between each of the insulating films 14 and the silicon pillar SP is divided by the central portion 14a of the insulating film 14, and is electrically separated between the adjacent memory cells in the Z direction. Therefore, there is no pathway for hopping-conducting the electrons injected into the charge storage layer 33 therethrough. As a result, the electrons stored in the charge storage layer 33 of one memory cell do not diffuse and move to the contiguous memory cell. Therefore, even if the device 1 is made to be finer, the interference between memory cells is small, and reliability when data are held in the memory cells can be maintained.

Furthermore, in this embodiment, one pair of charge storage layers 33 are provided in each of the memory cells, and disposed on the upper and lower sides of the electrode film WL. By combining this structure and the above driving method, two-bit data can be stored in each of the memory cells. As a result, chip area per bit can be more reduced.

Next, comparative example of this embodiment will be described.

Figure 27:
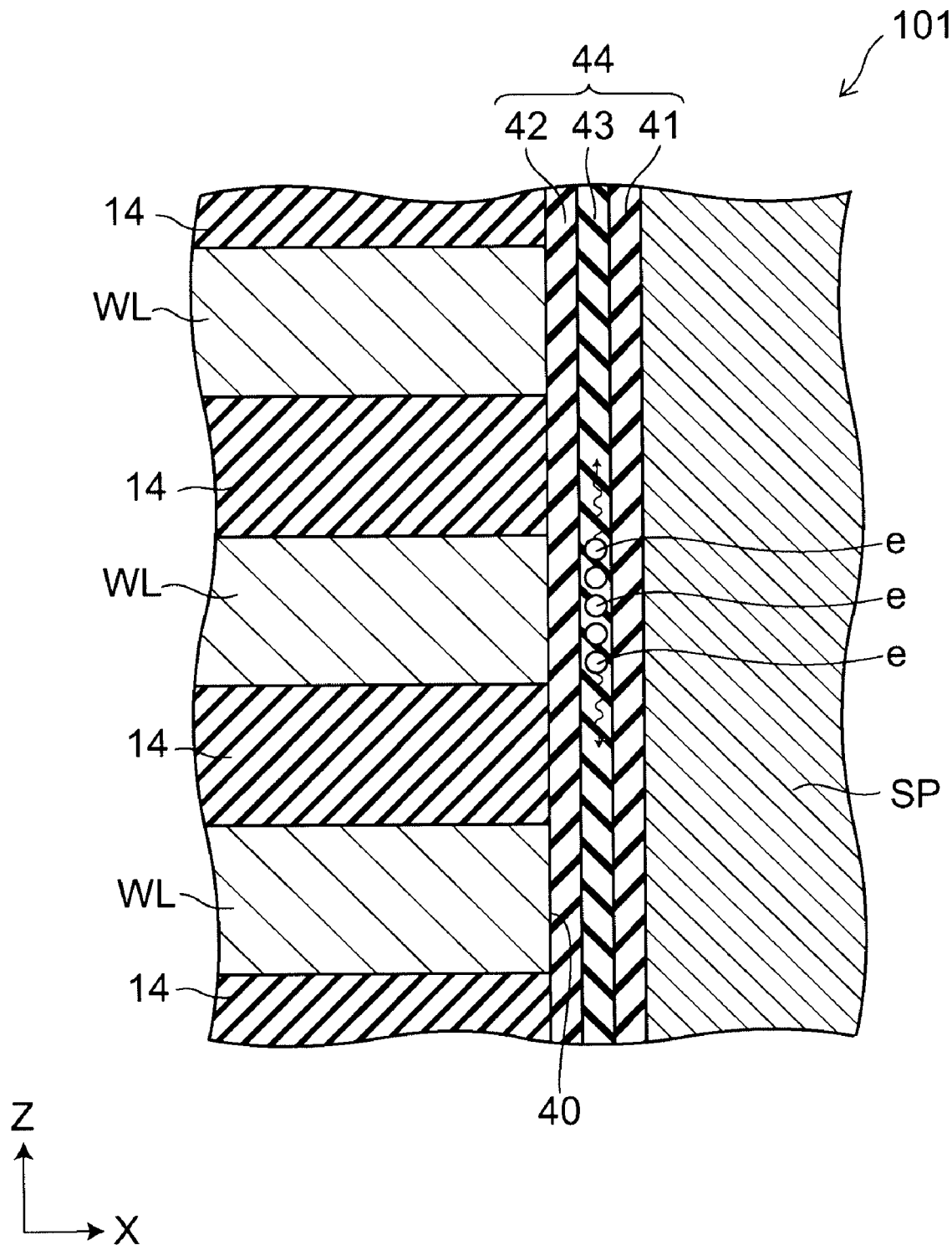
FIG. 27 is a cross-sectional view illustrating a nonvolatile semiconductor memory device according to a comparative example of this embodiment.

FIG. 27 is a cross-sectional view illustrating a nonvolatile semiconductor memory device according to this comparative example.

As shown in FIG. 27, in the nonvolatile semiconductor memory device 101 according to this comparative example, a side surface of a through-hole 40 has an approximately straight line shape in a section parallel to the Z direction, and an ONO film (Oxide Nitride Oxide film) 44 is provided on the side surface of the through-hole 40. In the ONO film 44, a block insulating layer 42 made of silicon oxide, a charge storage layer 43 made of silicon nitride, and a tunnel insulating layer 41 made of silicon oxide are stacked in this order sequentially from the electrode film WL side.

In the nonvolatile semiconductor memory device 101 according to this comparative example, the block insulating layer 42, the charge storage layer 43, and the tunnel insulating layer 41 are provided in this order on the side surface of the through-hole 40, namely, between the electrode film WL and the silicon pillar SP. And, it is necessary that the film thickness of the charge storage layer 43 is set to be a certain degree or more for ensuring the electron-capturing probability and storing charge of the sufficient amount. Moreover, it is necessary that the film thickness of the tunnel insulating layer 41 is set to be a certain degree or more for suppressing loss of charge stored in the charge storage layer 43 and holding the retention characteristic to be good. Furthermore, it is also necessary that the film thickness of the block insulating layer 42 is set to be a certain degree or more for suppressing injection of holes from the electrode film WL to the charge storage layer 43 to store charge of the sufficient amount in the charge storage layer 43 in writing data and therewith for suppressing injection of electrons from the electrode film WL to the charge storage layer 43 to certainly erase data in erasing data. If the thicknesses of these layers are short, the charge of the sufficient amount cannot be stored in the charge storage layer 43, and the data window, which is the difference between the threshold voltages of the data "0" and the data "1", cannot be ensured. Furthermore, it is also necessary that the diameter of the silicon pillar SP is set to be a certain degree or more for flowing the sense current. Therefore, in this comparative example, it is difficult to reduce the diameter of the through-hole 40 and downsizing of the planar structure thereof is difficult.

Moreover, in the nonvolatile semiconductor memory device 101 according to this comparative example, the charge storage layer 43 is formed along the side surface of the through-hole 40, and is formed continuously among a plurality of memory cells arranged along the Z direction. Therefore, the electrons e stored in a part belonging to a certain memory cell in the charge storage layer 43 come to be hopping-conducted to diffuse or move through the level in charge storage layer 43 by a force generated due to the self-electric field or the potential of the adjacent electric film WL. As a result, the amount of charge stored in a certain memory cell decreases with time, and the amount of the signal becomes small, and the data of the memory cell cannot be held. Moreover, if the electrons diffusing from one memory cell reach the contiguous memory cell sharing the charge storage layer 43, the threshold voltage of the cell transistor of the contiguous memory cell is changed, and the data is rewritten. Such interference between the memory cells becomes more significant as the device 101 is finer. Therefore, if the device according to this comparative example is finer, the interference between memory cells is larger.

Furthermore, in the nonvolatile semiconductor memory device 101 according to this comparative example, the charge storage layer 43 is not divided in the memory cell, and therefore, each of the memory cells can store only one-bit data.

As described above, the invention has been described with reference to the embodiments and the examples. However, the invention is not limited to the embodiments and the examples. For example, the above embodiments and examples that are subjected appropriately by those skilled in the art to addition or deletion of the components or to design modification or to addition or omission of steps or to condition modification are also included in the scope of the invention as long as having the spirit of the invention.

The invention claimed is:

1. A method for driving a nonvolatile semiconductor memory device, the device having a stacked body in which insulating films and n (n is an integer of two or more) electrode films are alternately stacked and in which a through-hole extending in a stacking direction is formed, a semiconductor pillar buried inside the through-hole, and one pair of charge storage layers disposed in both sides of the electrode film in the stacking direction for each of the electrode films, the method comprising:

giving relatively high potential to the electrode films of the number 1 to k (k is an integer of 1 to (n−1)) as counted from one end of the semiconductor pillar, giving relatively low potential to the electrode films of the number (k+1) to n, and therewith setting potential of the one end of the semiconductor pillar to be higher than potential of the other end, thereby injecting electrons into the charge storage layer on the other end side of one pair of the charge storage layers disposed on both sides of the electrode film of the number k.

2. The method according to claim 1, further comprising:

giving relatively low potential to the electrode films of the number 1 to k as counted from the one end of the semiconductor pillar, giving relatively high potential to the electrode films of the number (k+1) to n, and setting potential of the one end of the semiconductor pillar to be lower than potential of the other end, thereby injecting holes into the charge storage layer on the other end side of one pair of the charge storage layers disposed on both sides of the electrode film of the number k;

giving reading potential by which a resistance value of a part corresponding to the electrode film of the number j (j is an integer of 1 to n) of the semiconductor pillar is different according to whether electrons are stored in the charge storage layers on both sides of the electrode film of the number j, to the electrode film of the number j as counted from the one end of the semiconductor pillar, giving ON potential by which parts corresponding to the electrode films other than the electrode film of the number j of the semiconductor pillar are turned into ON state, to the electrode films other than the electrode film of the number j, in the state thereof, giving higher potential to the one end of the semiconductor pillar than that of the other end to detect current flowing through the semiconductor pillar, thereby discriminating that electrons are stored in both of the one pair of the charge storage layers disposed on both sides of the electrode film of the number j, that electrons are stored in only one of the both thereof or that electrons are not stored in the both thereof;

giving higher potential to the other end of the semiconductor pillar than that of the one end to detect current flowing through the semiconductor pillar while holding the state thereof when electrons are stored in only one of the one pair of charge storage layers, and thereby discriminating that electrons are stored in the charge storage layer on the one end side as seen from the electrode film of the number j of the one pair of charge storage layers or that electrons are stored in the charge storage layer on the other end side thereof.

3. The method according to claim 1, further comprising:

giving relatively low potential to the electrode films of the number 1 to k as counted from the one end of the semiconductor pillar, giving relatively high potential to the electrode films of the number (k+1) to n, and setting potential of the one end of the semiconductor pillar to be lower than potential of the other end, thereby injecting holes into the charge storage layer on the other end side of one pair of the charge storage layers disposed on both sides of the electrode film of the number k;

giving reading potential by which a resistance value of a part corresponding to the electrode film of the number j (j is an integer of 1 to n) of the semiconductor pillar is different according to whether electrons are stored in the charge storage layers on both sides of the electrode film of the number j, to the electrode film of the number j as counted from the one end of the semiconductor pillar, giving ON potential by which parts corresponding to the electrode films other than the electrode film of the number j of the semiconductor pillar are turned into ON state, to the electrode films other than the electrode film of the number j, in the state thereof, giving higher potential to the one end of the semiconductor pillar than that of the other end to detect current flowing through the semiconductor pillar, thereby discriminating that electrons are stored in both of the one pair of the charge storage layers disposed on both sides of the electrode film of the number j, that electrons are stored in only one of the both thereof or that electrons are not stored in the both thereof;

giving the reading potential to the electrode film of the number j and giving potential between the reading potential and the ON potential to the electrode film of the number (j+1) and giving the ON potential to the other electrode films and giving higher potential to the one end of the semiconductor pillar than that of the other end thereof to detect current flowing through the semiconductor pillar when electrons are stored in only one of the one pair of charge storage layers, and thereby discriminating that electrons are stored in the charge storage layer on the one end side as seen from the electrode film of the number j of the one pair of charge storage layers or that electrons are stored in the charge storage layer on the other end side thereof.

4. The method according to claim 1, further comprising:

giving relatively low potential to the electrode films of the number 1 to k as counted from the one end of the semiconductor pillar, giving relatively high potential to the electrode films of the number (k+1) to n, and setting potential of the one end of the semiconductor pillar to be lower than potential of the other end, thereby injecting holes into the charge storage layer on the other end side of one pair of the charge storage layers disposed on both sides of the electrode film of the number k;

giving reading potential by which a resistance value of a part corresponding to the electrode film of the number j (j is an integer of 1 to n) of the semiconductor pillar is different according to whether electrons are stored in the charge storage layers on both sides of the electrode film of the number j, to the electrode film of the number j as counted from the one end of the semiconductor pillar, giving ON potential by which parts corresponding to the electrode films other than the electrode film of the number j of the semiconductor pillar are turned into ON state, to the electrode films other than the electrode film of the number j, in the state thereof, giving higher potential to the one end of the semiconductor pillar than that of the other end to detect current flowing through the semiconductor pillar, thereby discriminating that electrons are stored in both of the one pair of the charge storage layers disposed on both sides of the electrode film of the number j, that electrons are stored in only one of the both thereof or that electrons are not stored in the both thereof;

increasing voltage between the one end and the other end of the semiconductor pillar to detect current flowing through the semiconductor pillar while holding the state thereof when electrons are stored in only one of the one pair of charge storage layers, and thereby discriminating that electrons are stored in the charge storage layer on the one end side as seen from the electrode film of the number j of the one pair of charge storage layers or that electrons are stored in the charge storage layer on the other end side thereof.

5. The method according to claim 1, wherein the injections are carried out with continuously increasing the value of k from 1 to (n−1), and then, giving the relatively high potential to all of the electrode films and therewith setting potential of the one end of the semiconductor pillar to be higher than potential of the other end thereof and thereby injecting electrons into the charge storage layer on the other end side of the one pair of the charge storage layers disposed on both sides of the electrode film of the number n.

6. The method according to claim 1, wherein the nonvolatile semiconductor memory device further has a tunnel insulating layer provided between the charge storage layer and the semiconductor pillar and a block insulating layer provided between the charge storage layer and the electrode film, and the charge storage layer is not provided between the central portion of the insulating film in the stacking direction and the semiconductor pillar.

7. The method according to claim 6, wherein the central portion of the insulating film in the stacking direction sticks out from the peripheral portions of the insulating film in the stacking direction to the semiconductor pillar side, and the charge storage layer is surrounded by the central portion, the peripheral portion, the block insulating layer, and the tunnel insulating layer.

8. A method for driving a nonvolatile semiconductor memory device, the device having, a stacked body in which insulating films and n (n is an integer of two or more) electrode films are alternately stacked and in which a through-hole extending in a stacking direction is formed, a semiconductor pillar buried inside the through-hole, and one pair of charge storage layers disposed on both sides of the electrode film in the stacking direction for each of the electrode films, the method comprising:

giving relatively low potential to the electrode films of the number 1 to k as counted from the one end of the semiconductor pillar, giving relatively high potential to the electrode films of the number (k+1) to n, therewith setting potential of the one end of the semiconductor pillar to be lower than potential of the other end, and thereby injecting holes into the charge storage layer on the other end side of one pair of the charge storage layers disposed on both sides of the electrode film of the number k.

9. The method according to claim 8, wherein the injections are carried out with continuously increasing the value of k from 1 to (n−1), and then, giving the relatively low potential to all of the electrode films and therewith setting potential of the one end of the semiconductor pillar to be lower than potential of the other end thereof and thereby injecting holes into the charge storage layer on the other end side of the one pair of the charge storage layers disposed on both sides of the electrode film of the number n.

10. The method according to claim 8, wherein the nonvolatile semiconductor memory device further has a tunnel insulating layer provided between the charge storage layer and the semiconductor pillar and a block insulating layer provided between the charge storage layer and the electrode film, and the charge storage layer is not provided between the central portion of the insulating film in the stacking direction and the semiconductor pillar.

11. The method according to claim 10, wherein the central portion of the insulating film in the stacking direction sticks out from the peripheral portions of the insulating film in the stacking direction to the semiconductor pillar side, and the charge storage layer is surrounded by the central portion, the peripheral portion, the block insulating layer, and the tunnel insulating layer.

12. A method for driving a nonvolatile semiconductor memory device, the device having a stacked body in which insulating films and n (n is an integer of two or more) electrode films are alternately stacked and in which a through-hole extending in a stacking direction is formed, a semiconductor pillar buried inside the through-hole, and one pair of charge storage layers disposed on both sides of the electrode film in the stacking direction for each of the electrode films, the method comprising:
   a first discriminating: giving reading potential by which a resistance value of a part corresponding to the electrode film of the number k (k is an integer of 1 to n) of the semiconductor pillar is different according to whether electrons are stored in the charge storage layers on both sides of the electrode film of the number k, to the electrode film of the number k as counted from the one end of the semiconductor pillar, giving ON potential by which parts corresponding to the electrode films other than the electrode film of the number k of the semiconductor pillar are turned into ON state, to the electrode films other than the electrode film of the number k, in the state thereof, giving higher potential to the one end of the semiconductor pillar than that of the other end to detect current flowing through the semiconductor pillar, and thereby discriminating that electrons are stored in both of the one pair of the charge storage layers disposed on both sides of the electrode film of the number k or that electrons are stored in only one of the both thereof or that electrons are not stored in the both thereof; and
   a second discriminating: discriminating that electrons are stored in the charge storage layer on the one end side as seen from the electrode film of the number k of the one pair of charge storage layers or that electrons are stored in the charge storage layer on the other end side thereof when electrons are stored in only one of the one pair of charge storage layers.

13. The method according to claim 12, wherein the second discriminating includes giving higher potential to the other end of the semiconductor pillar than that of the one end to detect current flowing through the semiconductor pillar while holding the state thereof.

14. The method according to claim 13, wherein in the second discriminating,
   if the current decreases when the higher potential is given to the other end of the semiconductor pillar than that of the one end thereof in comparison to the case where the higher potential is given to the one end than that of the other end, it is determined that electrons are stored in the charge storage layer on the one end side as seen from the electrode film of the number k, and
   if the current increases when the higher potential is given to the other end of the semiconductor pillar than that of the one end thereof in comparison to the case where the higher potential is given to the one end than that of the other end, it is determined that electrons are stored in the charge storage layer on the other end side as seen from the electrode film of the number k.

15. The method according to claim 12, wherein the second discriminating includes: giving the reading potential to the electrode film of the number k, giving potential between the reading potential and the ON potential to the electrode film of the number (k+1), giving the ON potential to the other electrode films, giving higher potential to the one end of the semiconductor pillar than that of the other end thereof, and thereby detecting current flowing through the semiconductor pillar.

16. The method according to claim 15, wherein in the second discriminating,
   if the decrease of the current is relatively small when the potential given to the electrode film of the number (k+1) is decreased from the reading potential to the potential between the reading potential and the ON potential, it is determined that electrons are stored in the charge storage layer on the one end side as seen from the electrode film of the number k, and
   if the decrease of the current is relatively large when the potential given to the electrode film of the number (k+1) is decreased from the reading potential to the potential between the reading potential and the ON potential, it is determined that electrons are stored in the charge storage layer on the other end side as seen from the electrode film of the number k.

17. The method according to claim 12, wherein the second discriminating includes increasing voltage between the one end and the other end of the semiconductor pillar to detect current flowing through the semiconductor pillar while holding the state thereof.

18. The method according to claim 17, wherein in the second discriminating,
   if the current does not change when voltage between the one end of the semiconductor pillar and the other end thereof is increased, it is determined that electrons are stored in the charge storage layer on the one end side as seen from the electrode film of the number k, and
   if the current decreases when voltage between the one end of the semiconductor pillar and the other end thereof is increased, it is determined that electrons are stored in the charge storage layer on the other end side as seen from the electrode film of the number k.

19. The method according to claim 12, wherein the nonvolatile semiconductor memory device further has a tunnel insulating layer provided between the charge storage layer and the semiconductor pillar and a block insulating layer provided between the charge storage layer and the electrode film, and the charge storage layer is not provided between the central portion of the insulating film in the stacking direction and the semiconductor pillar.

20. The method according to claim 19, wherein the central portion of the insulating film in the stacking direction sticks out from the peripheral portions of the insulating film in the stacking direction to the semiconductor pillar side, and the charge storage layer is surrounded by the central portion, the peripheral portion, the block insulating layer, and the tunnel insulating layer.

* * * * *